United States Patent
Park et al.

(10) Patent No.: US 10,056,431 B2
(45) Date of Patent: Aug. 21, 2018

(54) VARIABLE RESISTANCE MEMORY DEVICE

(71) Applicant: Samsung Electronics Co., Ltd., Suwon-si (KR)

(72) Inventors: Ilmok Park, Seoul (KR); Sungwon Kim, Hwaseong-si (KR); Seulji Song, Yongin-si (KR); Ji-Hyun Jeong, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/700,154

(22) Filed: Sep. 10, 2017

(65) Prior Publication Data
US 2018/0158872 A1 Jun. 7, 2018

(30) Foreign Application Priority Data
Dec. 7, 2016 (KR) .................. 10-2016-0166064

(51) Int. Cl.
*H01L 27/24* (2006.01)
*H01L 45/00* (2006.01)

(52) U.S. Cl.
CPC .......... *H01L 27/2463* (2013.01); *H01L 45/06* (2013.01); *H01L 45/1253* (2013.01)

(58) Field of Classification Search
CPC ............. H01L 45/1233; H01L 45/1253; H01L 45/126; H01L 45/1273
See application file for complete search history.

(56) References Cited

U.S. PATENT DOCUMENTS

| | | | |
|---|---|---|---|
| 8,426,840 B2 | 4/2013 | An et al. | |
| 8,468,692 B2 * | 6/2013 | Kim | H01L 45/04 257/295 |
| 8,507,353 B2 | 8/2013 | Oh et al. | |
| 8,519,371 B2 | 8/2013 | Fukumizu et al. | |
| 8,822,969 B2 * | 9/2014 | Hwang | H01L 45/126 257/4 |
| 8,871,559 B2 | 10/2014 | Horii et al. | |
| 8,980,679 B2 | 3/2015 | Im et al. | |
| 9,029,828 B2 | 5/2015 | Oh | |
| 9,412,941 B2 | 8/2016 | Zanderighi et al. | |
| 9,444,043 B2 | 9/2016 | Pellizzer et al. | |

FOREIGN PATENT DOCUMENTS

KR 10-1038311 B1 5/2011

* cited by examiner

*Primary Examiner* — Allison P Bernstein
(74) *Attorney, Agent, or Firm* — Muir Patent Law, PLLC

(57) ABSTRACT

A variable resistance memory device may include a word line extending in a first direction, a bit line extending in a second direction crossing the first direction, a phase-changeable pattern provided between the word line and the bit line, a bottom electrode provided between the phase-changeable pattern and the word line, and a spacer provided on a side surface of the bottom electrode and between the phase-changeable pattern and the word line. The bottom electrode may include a first portion and a second portion, and the second portion is provided between the first portion and the spacer. The first and second portions of the bottom electrodes may have different lengths from each other in the second direction.

20 Claims, 21 Drawing Sheets

VARIABLE RESISTANCE MEMORY DEVICE

CROSS-REFERENCE TO RELATED APPLICATIONS

This U.S. non-provisional patent application claims priority under 35 U.S.C. § 119 to Korean Patent Application No. 10-2016-0166064, filed on Dec. 7, 2016, in the Korean Intellectual Property Office, the entire contents of which are hereby incorporated by reference.

BACKGROUND OF THE INVENTION

The present disclosure relates to a variable resistance memory device, e.g., to a variable resistance memory device with improved reliability.

Semiconductor devices are generally classified into memory devices and logic devices. The memory devices for storing data are classified into volatile memory devices and nonvolatile memory devices. The volatile memory devices may lose their stored data when their power supplies are interrupted. The volatile memory devices may, for instance, include a dynamic random access memory (DRAM) and a static random access memory (SRAM). The nonvolatile memory devices may maintain their stored data even when their power supplies are interrupted and may, for instance, include a programmable read only memory (PROM), an erasable PROM (EPROM), an electrically erasable PROM (EEPROM), a flash memory device.

In addition, to meet the recent demand for semiconductor memory devices with high performance and low power consumption, next-generation semiconductor memory devices have been developed. For example, a ferroelectric random access memory (FRAM), a magnetic random access memory (MRAM), and a phase change random access memory (PRAM) are developed as candidates for the next-generation semiconductor memory devices. In the next-generation semiconductor memory devices, a material or structure, whose resistance can be changed by a current or voltage forced thereto and can be maintained even when a current or voltage supply is interrupted, is used as a memory element.

SUMMARY

Some embodiments of the inventive concept provide a variable resistance memory device with improved reliability.

According to some embodiments of the inventive concept, a variable resistance memory device may include a word line extending in a first direction, a bit line extending in a second direction crossing the first direction, a phase-changeable pattern provided between the word line and the bit line, a bottom electrode provided between the phase-changeable pattern and the word line, and a spacer provided on a side surface of the bottom electrode and between the phase-changeable pattern and the word line. The bottom electrode may include a first portion and a second portion, and the second portion is provided between the first portion and the spacer. The first and second portions may have different lengths from each other in the second direction.

According to some embodiments of the inventive concept, a variable resistance memory device may include word lines extending in a first direction, bit lines extending in a second direction crossing the first direction, phase-changeable patterns provided between the word lines and the bit lines, bottom electrodes provided between the phase-changeable patterns and the word lines, and spacers provided on side surfaces of the bottom electrodes and between the phase-changeable patterns and the word lines. Each of the bottom electrodes may include a first portion and a second portion, and the second portion is disposed between the first portion and a corresponding spacer contacting the second portion. A distance between the first portions of the bottom electrodes adjacent to each other in the second direction may be larger than a distance between the second portions of the bottom electrodes adjacent to each other in the second direction.

According to some embodiments of the present disclosure, a memory device includes a word line formed on a substrate, the word line extending in a first direction, a bit line formed on the substrate, the bit line extending in a second direction crossing the first direction, a first electrode pattern formed on the word line, a phase-changeable pattern formed on the first electrode pattern, the phase-changeable pattern contacting the first electrode, a first insulator pattern formed between the phase-changeable pattern and the word line, the first insulator pattern being in contact with the phase-changeable pattern and the first electrode, and a second electrode pattern formed on the phase-changeable pattern, the second electrode pattern being in contact with the phase-changeable pattern, wherein a contact surface of the first insulator pattern where it contacts the phase-changeable pattern is longer than a contact surface of the first electrode where it contacts the phase-changeable pattern in the second direction.

BRIEF DESCRIPTION OF THE DRAWINGS

Example embodiments will be more clearly understood from the following description taken in conjunction with the accompanying drawings. The accompanying drawings represent non-limiting, example embodiments as described herein.

FIGS. 6A to 11A are plan views illustrating a method of fabricating a variable resistance memory device, according to some embodiments of the inventive concept.

FIGS. 6B to 11B are cross-sectional views, which are taken along I-I' of FIGS. 6A to 11A respectively to illustrate a method of fabricating a variable resistance memory device, according to some embodiments of the inventive concept.

FIGS. 6C to 11C are cross-sectional views, which are taken along II-II' of FIGS. 6A to 11A respectively to illustrate a method of fabricating a variable resistance memory device, according to some embodiments of the inventive concept.

Figure 1:
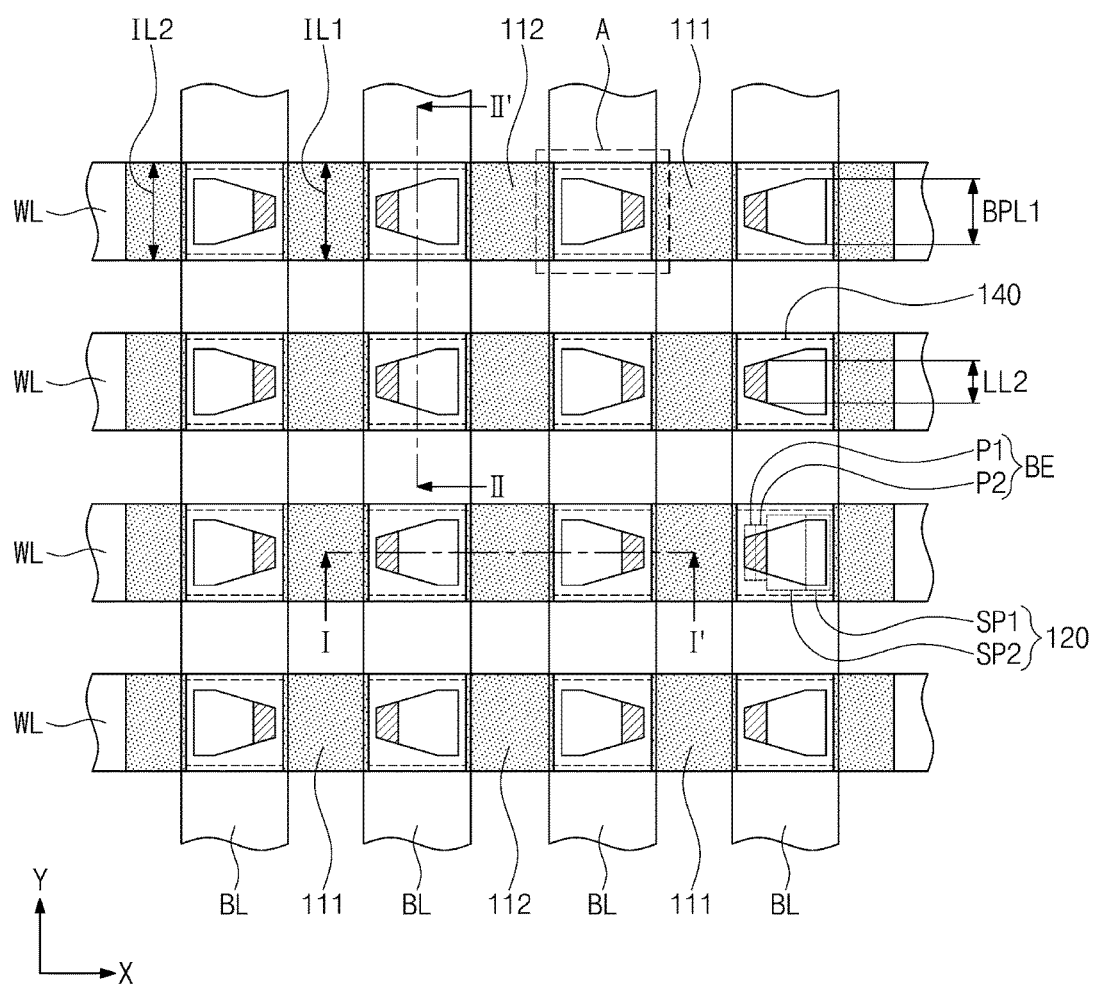
FIG. 1 is a plan view illustrating a variable resistance memory device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that— examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

Example embodiments of the inventive concepts will now be described more fully with reference to the accompanying drawings, in which example embodiments are shown.

Figure 2A:
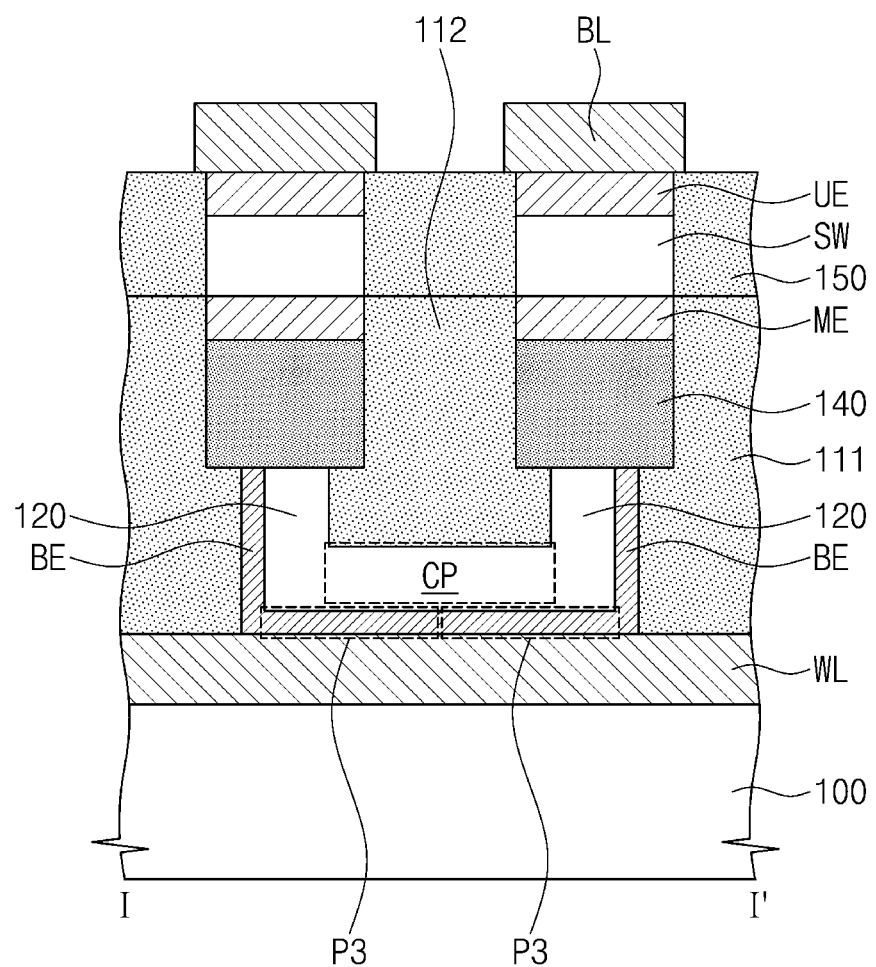
FIG. 2A is a cross-sectional view, which is taken along line I-I' of FIG. 1 to illustrate a variable resistance memory device according to some embodiments of the inventive concept.
Figure 2B:
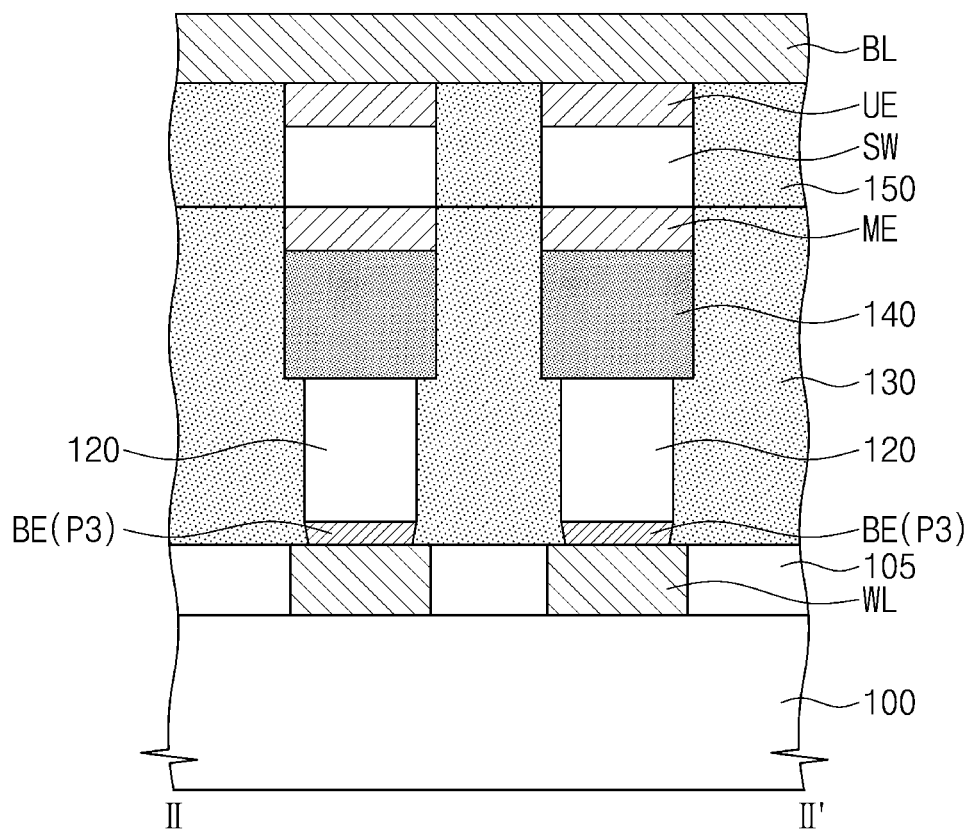
FIG. 2B is a cross-sectional view, which is taken along line II-II' of FIG. 1 to illustrate a variable resistance memory device according to some embodiments of the inventive concept.
Figure 3A:
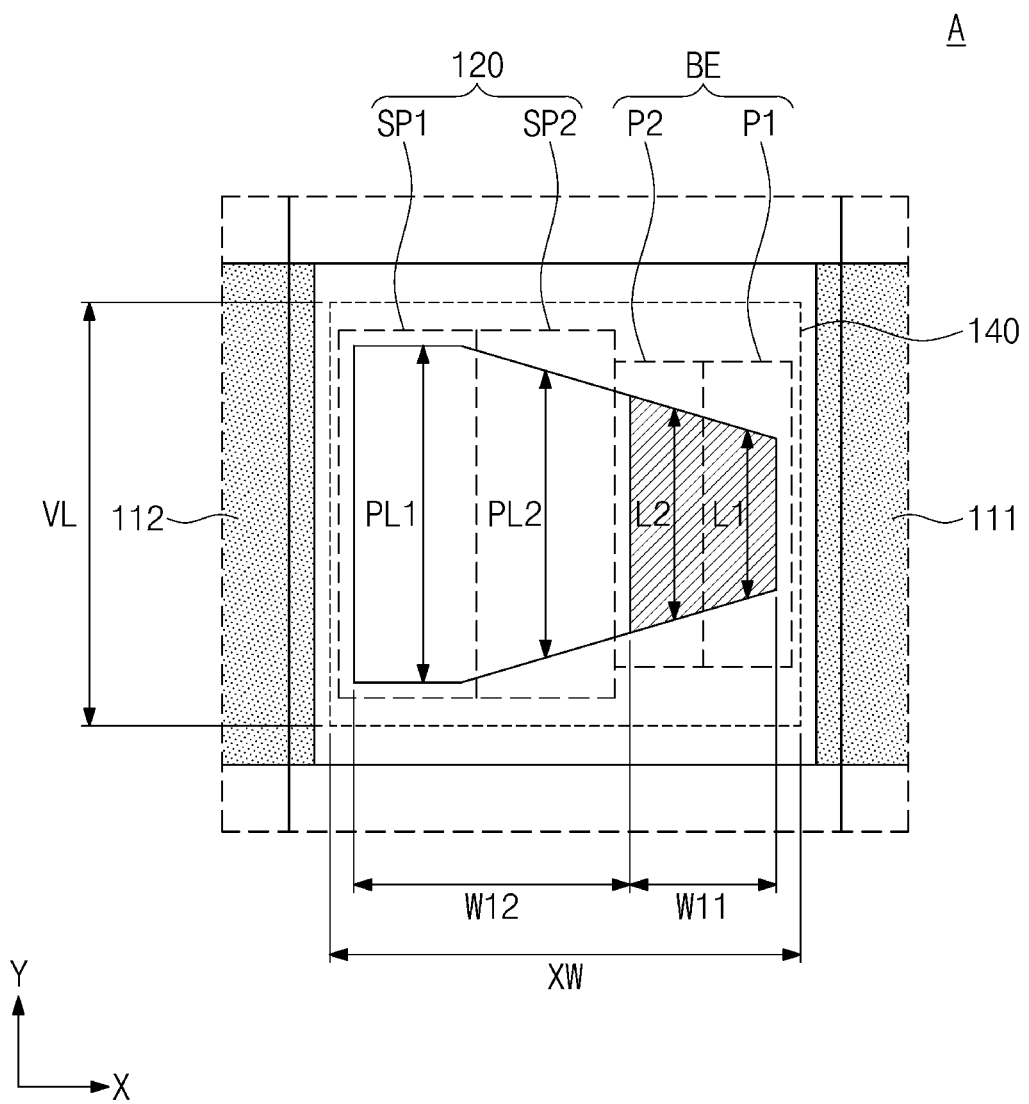
FIG. 3A is an enlarged plan view of a portion 'A' of FIG. 1.
Figure 3B:
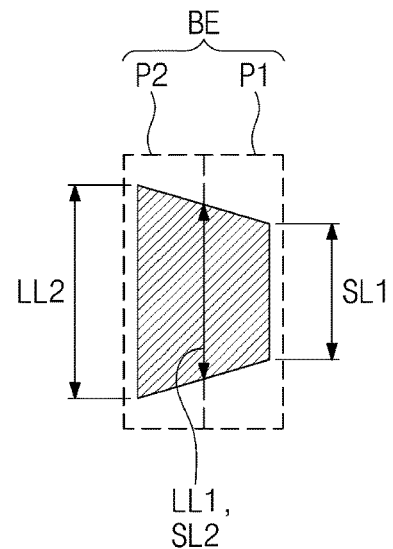
FIG. 3B is an enlarged diagram of a bottom electrode.
Figure 3C:
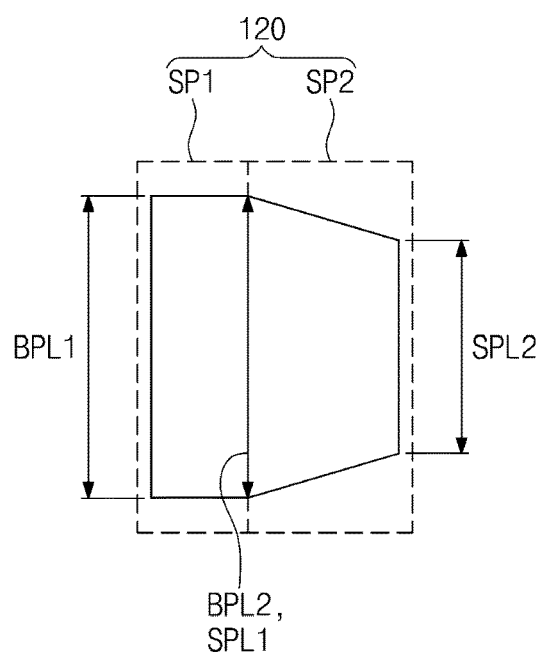
FIG. 3C is an enlarged diagram of a spacer.
Figure 4:
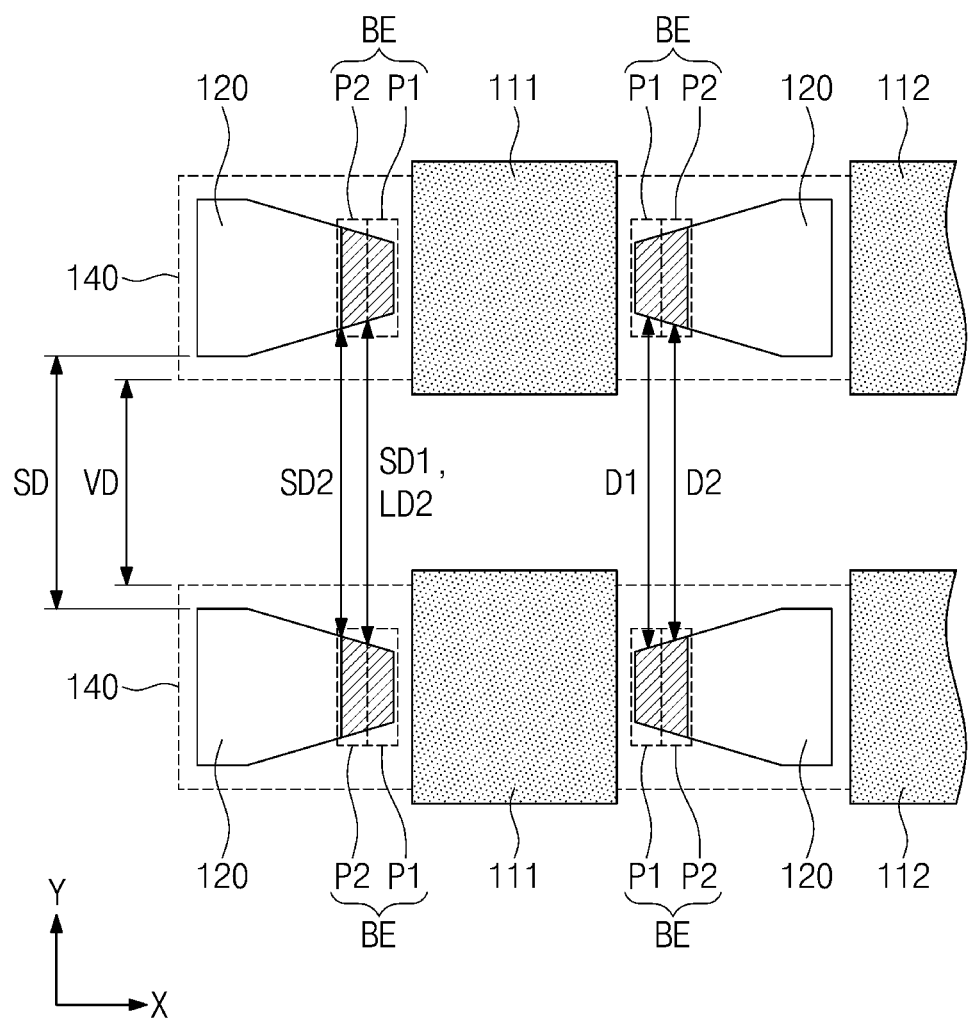
FIG. 4 is an enlarged diagram illustrating spacers, bottom electrodes, and phase-changeable patterns, according to some embodiments of the inventive concept.

FIG. 1 is a plan view illustrating a variable resistance memory device according to some embodiments of the inventive concept. FIGS. 2A and 2B are cross-sectional views, which are taken along lines I-I' and respectively, of FIG. 1 to illustrate a variable resistance memory device according to some embodiments of the inventive concept. FIG. 3A is an enlarged plan view of a portion 'A' of FIG. 1, and FIGS. 3B and 3C are enlarged diagrams illustrating a bottom electrode and a spacer, respectively. FIG. 4 is an enlarged diagram illustrating spacers, bottom electrodes, and phase-changeable patterns, according to some embodiments of the inventive concept.

Referring to FIGS. 1, 2A, and 2B, a variable resistance memory device may include a substrate 100, word lines WL, bit lines BL, bottom electrodes BE, phase-changeable patterns 140, and switching devices SW. The substrate 100 may be formed of or include a single-crystalline semiconductor material. For example, the substrate 100 may be a silicon substrate, a silicon-on-insulator (SOI) substrate, a germanium substrate, a germanium-on-insulator (GOI) substrate, and/or a silicon-germanium substrate.

A first interlayered insulating layer 105 may be provided on the substrate 100. The first interlayered insulating layer 105 may be formed of or include, for example, silicon nitride. The word lines WL may be provided on the substrate 100. The word lines WL may be provided to penetrate the first interlayered insulating layer 105. The word lines WL may be parallel to each other and extend in a first direction X. The word lines WL may include a conductive material. For example, the word lines WL may be formed of or include at least one of metallic materials (e.g., copper and aluminum) or conductive metal nitride materials (e.g., TiN and WN).

The bit lines BL may be provided on the word lines WL. The bit lines BL may be parallel to each other and may extend in a second direction Y crossing the first direction X. For example, the bit lines BL may cross the word lines WL perpendicularly. The bit lines BL may include a conductive material. For example, the bit lines BL may be formed of or include at least one of metallic materials (e.g., copper and aluminum) or conductive metal nitride materials (e.g., TiN and WN).

The phase-changeable patterns 140 may be provided between the word lines WL and the bit lines BL. For example, the phase-changeable patterns 140 may be provided at respective intersections of the bit lines BL and the word lines WL. The phase-changeable patterns 140 may be arranged to be spaced apart from each other in the first and second directions X and Y. The phase-changeable patterns 140 may include at least one of materials exhibiting a data-storing property. For example, the phase-changeable patterns 140 may include a material whose phase is reversibly switched between crystalline and amorphous states depending on its temperature. As an example, the phase-changeable patterns 140 may be formed of a compound containing at least one of chalcogenide elements (e.g., Te and Se) and at least one of, for example, Ge, Sb, Bi, Pb, Sn, Ag, As, S, Si, In, Ti, Ga, P, O, or C. As an example, the phase-changeable patterns 140 may be formed of or include at least one of GeSbTe, GeTeAs, SbTeSe, GeTe, SbTe, SeTeSn, GeTeSe, SbSeBi, GeBiTe, GeTeTi, InSe, GaTeSe, or InSbTe.

In certain embodiments, the phase-changeable patterns 140 may be formed of or include at least one of perovskite compounds or conductive metal oxides. For example, the phase-changeable patterns 140 may be formed of or include at least one of niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, or barium-strontium-zirconium oxide. In the case where the phase-changeable patterns 140 include a transition metal oxide, the phase-changeable patterns 140 may have a dielectric constant higher than that of a silicon oxide layer. In certain embodiments, the phase-changeable patterns 140 may have a double-layered structure including a conductive metal oxide layer and a tunnel insulating layer or a triple-layered structure including a first conductive metal oxide layer, a tunnel insulating layer, and a second conductive metal oxide. The tunnel insulating layer may include a layer of aluminum oxide, hafnium oxide, or silicon oxide.

Spacers 120 may be provided between the phase-changeable patterns 140 and the word lines WL. The spacers 120 may be spaced apart from each other and discretely arranged in the first and second directions X and Y. As shown in the drawings, a connecting portion CP may be disposed between a pair of the spacers 120 adjacent to each other in the first direction X. For example, the pair of the spacers 120 may be physically connected to each other through the connecting portion CP. For example, the connecting portion CP may be formed of the same material as the material forming the pair of adjacent spacers 120. For example, the connecting portion CP and a pair of adjacent spacers 120 connected by the connecting portion CP may be formed by a same patterning process. For example, each of the spacers 120 may contact a phase-changeable pattern 140 at one portion, and may contact a third portion P3 of a bottom electrode BE at another portion, thereby extending between the phase-changeable pattern 140 and the third portion P3 of the bottom electrode BE. For example, each of the connecting portions CP may extend in the first direction X, and two adjacent spacers 120 may extend perpendicularly with respect to the first direction X and the second direction Y. For example, the two adjacent spacers 120 may extend vertically with respect to a substrate on which the spacers 120 are disposed. While vertically extending portions of the spacers 120 may be indicated as spacers, a connecting portion CP connecting a pair of adjacent spacers 120 may also be a portion of the spacers 120. For example, the connecting portion CP may extend horizontally between a pair of adjacent spacers 120. For example, a pair of adjacent spacers 120 in the first direction X may share a connecting portion CP connecting the pair of adjacent spacers 120. For example, the connecting portion CP may be included in either of the pair of spacers 120 connected to each other through the connecting portion CP. For example, a pair of spacers 120 and their corresponding connecting portion CP may be generally and/or collectively referred to as "spacer". Therefore, specific meanings of the spacer 120 and connecting portion CP may be determined by respective contexts. For example, lower portions of the pair of the spacers 120 may be connected to each other through the connecting portion CP. In a cross-sectional view, the pair of the spacers 120 and the connecting portion CP may be provided to have a 'U'-shaped cross-section. Although not illustrated in the drawings, in certain embodiments, the spacers 120 arranged in the first direction X may be physically separated from each other. For example, in certain embodiments, each of the spacers 120 may not be connected to another spacer 120 with the same material as the one forming the spacers 120. The spacers 120 may be formed of or include, for example, silicon oxide or poly silicon. A detailed shape of the spacers 120 will be described below.

The bottom electrodes BE may be provided between the phase-changeable patterns 140 and the word lines WL and on side surfaces of the spacers 120. The bottom electrodes BE may be spaced apart from each other and discretely arranged in the first and second directions X and Y. In a plan view, the bottom electrodes BE adjacent to each other in the first direction X may be in line symmetry with respect to each other. For example, the bottom electrodes BE adjacent to each other in the first direction X may be in plane symmetry or mirror symmetry with respect to each other in a three-dimensional coordinate system. Each of the bottom electrodes BE may be electrically connected to a corresponding one of the phase-changeable patterns 140 disposed directly thereon. The bottom electrodes BE may be configured to heat the phase-changeable patterns 140 respectively disposed thereon; for example, each of the bottom electrodes BE may be used as a heater electrode to change a physical phase of a corresponding phase-changeable pattern 140. For example, the phase-changeable patterns 140 may be changed from an amorphous phase to a crystal phase by heat provided to the phase-changeable patterns 140. The bottom electrodes BE may be formed of or include at least one of W, Ti, Al, Cu, C, CN, TiN, TiAlN, TiSiN, TiCN, WN, CoSiN, WSiN, TaN, TaCN, TaSiN, or TiO.

For example, each of the bottom electrodes BE may contact a word line WL at one portion and may contact a phase-changeable pattern 140 at another portion of the bottom electrode BE, thereby extending between the word line WL and the phase-changeable pattern 140. Each of the bottom electrodes BE may include a first portion P1 and a second portion P2. The second portion P2 may be provided between the first portion P1 and a spacer 120. For example, the first portion P1 and the second portion P2 may extend vertically. Detailed shape of the first and second portions P1 and P2 will be described below.

Each of the bottom electrodes BE may include a third portion P3 extending into a space between a spacer 120 and a word line WL. The third portion P3 may be interposed between the spacer 120 and the word line WL. For example, the third portion P3 of the bottom electrode BE may be interposed between a connecting portion CP of the spacer 120 and the word line WL. For example, the third portion P3 of the bottom electrode BE may extend horizontally toward another third portion P3 of an adjacent bottom electrode BE. An upper portion of the third portion P3 may be adjacent to the spacer 120, and a lower portion of the third portion P3 may be adjacent to the word line WL. For example, an upper portion of the third portion P3 may be adjacent to the connecting portion CP of the spacer 120. In some embodiments, when measured in the second direction Y, an upper width of the third portion P3 may be larger than a lower width of the third portion P3. The upper width of the third portion P3 may be substantially equal to a width of the spacer 120 in the second direction Y. For example, the upper width of the third portion P3 may be substantially the same as a width of the connecting portion CP of the spacer 120. Side surfaces of third portions P3 facing each other in the second direction Y may be at an acute angle to a top surface of the word line WL. For example, side surfaces of third portions P3 facing each other in the second direction Y may be inclined toward each other.

In some embodiments, an oxygen content of the upper portion of the third portion P3 may be different from that of the lower portion of the third portion P3. For example, the oxygen content of the upper portion of the third portion P3 may be higher than that of the lower portion of the third portion P3. Oxygen atoms in the spacer 120 may be diffused into the third portion P3 of the bottom electrode BE adjacent to the spacer 120, and in this case, oxygen atoms may be included in the third portion P3. For example, oxygen atoms may transfer from a connecting portion CP of the spacer 120 to the third portions P3 of the bottom electrodes BE.

As shown in the drawings, third portions P3 adjacent to each other in the first direction X may extend into a space between a connecting portion CP of a pair of spacers 120 and the word line WL and may be used to physically connect a corresponding adjacent pair of bottom electrodes BE in the first direction X. For example, a pair of bottom electrodes BE adjacent to each other in the first direction X may be connected to each other with a continuous pattern. For example, a pair of bottom electrodes BE may be connected at respective third portions P3 of the bottom electrodes BE. The adjacent pair of the bottom electrodes BE may be electrically connected in common to one of the word lines WL and may be electrically connected to respective ones of the bit lines BL. In a cross-sectional view, the pair of the bottom electrodes BE, which are physically connected to each other, may have a 'U'-shape. For example, third portions P3 of adjacent a pair of bottom electrodes BE contact together to form a U-shape in a cross-sectional view. Although not illustrated in the drawings, in certain embodiments, the bottom electrodes BE arranged in the first direction X may be physically separated from each other. For example, in certain embodiments, each of the bottom electrodes BE may not be connected to another bottom electrode BE with a continuous pattern having the same material as the one forming the bottom electrodes BE.

The shapes of the bottom electrode BE and the spacer 120 will be described in more detail with reference to FIGS. 3A to 3C.

Referring to FIGS. 3A and 3B, when measured in the second direction Y in a plan view, a length L1 of the first portion P1 of the bottom electrode BE may be smaller than a length L2 of the second portion P2 of the bottom electrode BE. For example, when measured in the second direction Y, a shortest length SL1 of the first portion P1 may be smaller than a shortest length SL2 of the second portion P2, and a longest length LL1 of the first portion P1 may be smaller than a longest length LL2 of the second portion P2. The longest length LL1 of the first portion P1 may be substantially equal to the shortest length SL2 of the second portion P2. As an example, the bottom electrode BE may have a trapezoidal shape, e.g., top surface in a plan view as shown in FIGS. 3A and 3B. For example, the trapezoidal shape of the bottom electrode BE may have a pair of parallel sides extending in the second direction Y. For example, a first side of the pair of parallel sides may be positioned at a border between the bottom electrode BE and the spacer 120, and a second side of the pair of parallel sides may opposite the first side. For example, the first side is longer than the second side of the trapezoidal shape of the bottom electrode BE.

The shortest length SL1 of the first portion P1 may correspond to the shortest length of each of the bottom electrodes BE, and the longest length LL2 of the second portion P2 may correspond to the longest length of the bottom electrode BE. As an example, the longest length LL2 of the bottom electrode BE may be smaller than a length VL of the corresponding phase-changeable patterns 140 in the second direction Y. For example, the descriptions in the previous, this and following paragraphs with respect to FIGS. 3A and 3B and their related features may be applied to a plan view of a contact surface of the bottom electrode BE to the phase-changeable pattern 140.

In some embodiments, an oxygen content of the first portion P1 may be lower than that of the second portion P2. For example, the oxygen content may be non-uniform in the second portion P2. For example, the oxygen content of the second portion P2 may be higher at a region adjacent to the spacer 120 than at another region adjacent to the first portion P1. In certain cases, oxygen atoms in the spacer 120 may be diffused into the second portion P2 of the bottom electrode BE adjacent to the spacer 120, and in this case, oxygen atoms may be included in the second portion P2 of the bottom electrode BE.

Referring to FIGS. 3A and 3C, the spacer 120 may include a first spacer portion SP1 and a second spacer portion SP2, which is provided between the first spacer portion SP1 and the bottom electrode BE. When measured in the second direction Y in a plan view, a length PL1 of the first spacer portion SP1 may be larger than a length PL2 of the second spacer portion SP2. For example, when measured in the second direction Y, a shortest length SPL2 of the second spacer portion SP2 may be smaller than a shortest length SPL1 of the first spacer portion SP1. A longest length BPL2 of the second spacer portion SP2 may be substantially equal to the shortest length SPL1 of the first spacer portion SP1 and a longest length BPL1 of the first spacer portion SP1. For example, the descriptions in the previous, this, and following paragraphs with respect to FIGS. 3A and 3C and their related features may be applied to a plan view of a contact surface of the spacer 120 to the phase-changeable pattern 140.

The shortest length SPL2 of the second spacer portion SP2 may correspond to the shortest length of the spacer 120, and the longest length BPL1 of the first spacer portion SP1 may correspond to the longest length of the spacer 120. As an example, the shortest length SPL2 of the second spacer portion SP2 may be substantially equal to the longest length LL2 of the second portion P2 of the bottom electrode BE. As an example, when measured in the second direction Y, the longest length BPL1 of the spacer 120 may be smaller than the length VL of the corresponding phase-changeable patterns 140. As an example, when measured in the first direction X, a sum of a largest width W11 of the bottom electrode BE and a largest width W12 of the spacer 120 contacting the bottom electrode BE may be smaller than a width XW of the corresponding phase-changeable patterns 140 e.g., contacting the bottom electrode BE (i.e., W11+W12<XW). For example, a third portion P3 of the bottom electrode BE may be interposed between the word line WL and respective bottom portions of a first spacer portion SP1 and a second spacer portion SP2 as shown in FIG. 2B.

Referring to FIG. 4, a distance D1 between the first portions P1 of the bottom electrodes BE adjacent to each other in the second direction Y may be larger than a distance D2 between the second portions P2 of the bottom electrodes BE adjacent to each other in the second direction Y. A shortest distance SD1 between the first portions P1 adjacent to each other in the second direction Y may be substantially equal to a longest distance LD2 between the second portions P2 adjacent to each other in the second direction Y. As an example, a shortest distance SD2 between the second portions P2 adjacent to each other in the second direction Y may correspond to a shortest distance between the bottom electrodes BE adjacent to each other in the second direction Y. The shortest distance SD2 between the bottom electrodes BE may be larger than a distance VD between the phase-changeable patterns 140 adjacent to each other in the second direction Y. As an example, a shortest distance SD between the spacers 120 adjacent to each other in the second direction Y may be larger than the distance VD between the phase-changeable patterns 140 adjacent to each other in the second direction Y.

Referring back to FIGS. 1, 2A, and 2B, middle electrodes ME may be provided between the phase-changeable patterns 140 and the bit lines BL. The middle electrodes ME may be provided to have widths, which are substantially equal to those of the phase-changeable patterns 140. The middle electrodes ME may be formed of or include at least one of W, Ti, Al, Cu, C, CN, TiN, TiAlN, TiSiN, TiCN, WN, CoSiN, WSiN, TaN, TaCN, TaSiN, or TiO.

First insulating patterns 111 may be provided between the first portions P1 of the bottom electrodes BE adjacent to each other in the first direction X. The first insulating patterns 111 may be provided on the word lines WL. For example, the first insulating patterns 111 may be provided to fill gap regions between the phase-changeable patterns 140 adjacent to each other in the first direction X and between the middle electrodes ME adjacent to each other in the first direction X. Top surfaces of the first insulating patterns 111 may be located at substantially the same level as those of the middle electrodes ME. When measured in the second direction Y, the longest length BPL1 of each of the spacers 120 and the longest length LL2 of each of the bottom electrodes BE may be smaller than a length IL1 of the corresponding first insulating pattern 111. The first insulating patterns 111 may be formed of or include, for example, silicon nitride.

Second insulating patterns 112 may be provided between the first spacer portions SP1 adjacent to each other in the first direction X. The second insulating patterns 112 may be provided on the word lines WL. In some embodiments, the first insulating patterns 111 and the second insulating patterns 112, which are provided on each of the word lines WL, may be alternately arranged in the first direction X, with the phase-changeable patterns 140 interposed therebetween. For example, each of the phase-changeable patterns 140 may be interposed between a first insulating pattern 111 and a second insulating pattern 112 in the first direction X. The second insulating patterns 112 may be provided to fill gap regions between the phase-changeable patterns 140 adjacent to each other in the first direction X and between the middle electrodes ME adjacent to each other in the first direction X. Top surfaces of the second insulating patterns 112 may be located at substantially the same level as those of the middle electrodes ME. When measured in the second direction Y, the length IL1 of the first insulating pattern 111 may be substantially equal to a length IL2 of each of the second insulating patterns 112. The second insulating patterns 112 may be formed of or include, for example, silicon nitride.

Third insulating patterns 130 may be provided between adjacent ones of the word lines WL, e.g., in a plan view, and on a top surface of the first interlayered insulating layer 105. The third insulating patterns 130 may be provided on the top surface of the first interlayered insulating layer 105 to extend in the first direction X and parallel to the word lines WL. In some embodiments, the third insulating patterns 130 may be formed to fill spaces between the bottom electrodes BE adjacent to each other in the second direction Y, between the spacers 120 adjacent to each other in the second direction Y, between the phase-changeable patterns 140 adjacent to each other in the second direction Y, between the middle electrodes ME adjacent to each other in the second direction Y, between the first insulating patterns 111 adjacent to each other in the second direction Y, and between the second insulating patterns 112 adjacent to each other in the second direction Y. Top surfaces of the third insulating patterns 130 may be located at substantially the same level as those of the middle electrodes ME. The third insulating patterns 130 may be formed of or include, for example, silicon nitride.

A second interlayered insulating layer 150 may be provided on the first insulating patterns 111, the second insulating patterns 112, and the third insulating patterns 130. The second interlayered insulating layer 150 may be formed of or include an insulating material (e.g., silicon nitride).

The switching devices SW may be provided between the middle electrodes ME and the bit lines BL. In some embodiments, the switching devices SW may be provided in the second interlayered insulating layer 150. The switching devices SW may be configured to electrically connect the bit lines BL to the middle electrodes ME. In the case where a voltage is applied to a switching device SW through a bit line BL, it may change an electrical conduction state of the switching device SW (e.g., from an insulating state to a conductive state). For example, electric current passing through the switching device SW may be controlled to heat the bottom electrode BE, and heat generated from the bottom electrode BE may be used to change the electrical conduction state of the switching device SW.

Each of the switching devices SW may be or include an ovonic threshold switch (OTS) device having bi-directional switching characteristics. As an example, the switching device SW may be or include a device having nonlinear I-V characteristics (e.g., an 'S'-shaped I-V curve), based on a threshold switching phenomenon. In some embodiments, the switching devices SW may be configured in such a way that its phase transition temperature between crystalline and amorphous phases is higher than that of the phase-changeable patterns 140. For example, the phase transition temperature of the switching devices SW may range from about 350° C. to about 450° C. For example, in an operation of the variable resistance memory device according to some embodiments of the inventive concept, an operation voltage may be applied to the phase-changeable pattern 140 through the switching device SW. By the operation voltage, the phase of the phase-changeable pattern 140 may reversibly switch between the crystalline and amorphous phases, without change of phase of the switching device SW and keeping the amorphous phase of the switching device SW.

The switching devices SW may be formed of a compound containing at least one of chalcogenide elements (e.g., Te and Se) and at least one of, for example, Ge, Sb, Bi, Al, Pb, Sn, Ag, As, S, Si, In, Ti, Ga, or P. The switching devices SW may further contain a thermal stabilization element, in addition to the compound. The thermal stabilization element may be at least one of C, N, or O. As an example, the switching devices SW may be formed of or include at least one of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, or GeAsBiSe.

Upper electrodes UE may be provided between the bit lines BL and the switching devices SW. The upper electrodes UE may be provided in the second interlayered insulating layer 150. The upper electrodes UE may be configured to electrically connect the bit lines BL to the switching devices SW. The upper electrodes UE may be formed of or include, for example, at least one of W, Ti, Al, Cu, C, CN, TiN, TiAlN, TiSiN, TiCN, WN, CoSiN, WSiN, TaN, TaCN, TaSiN, or TiO.

Figure 5:
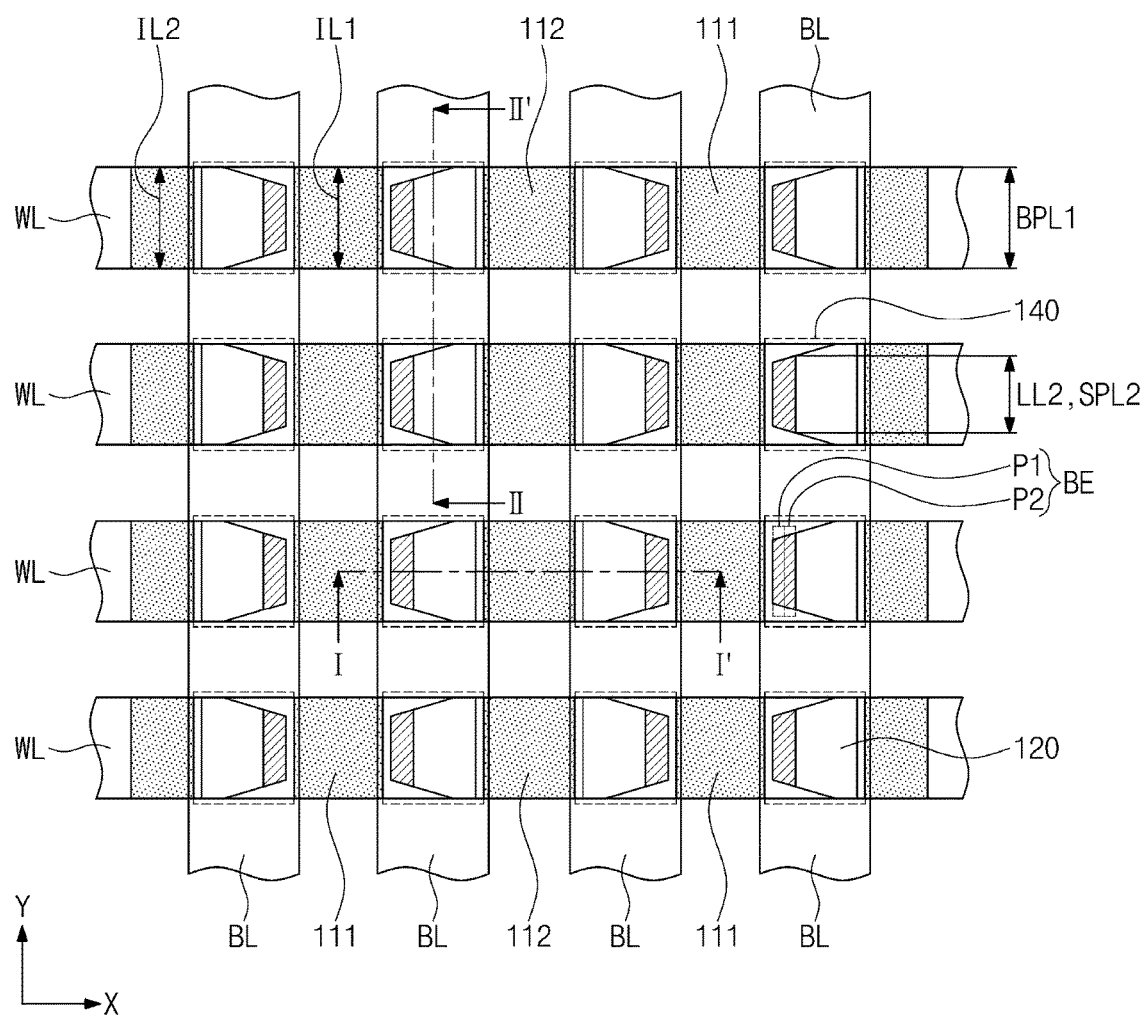
FIG. 5 is a plan view illustrating a variable resistance memory device according to some embodiments of the inventive concept.

FIG. 5 is a plan view illustrating a variable resistance memory device according to some embodiments of the inventive concept. For concise description, a previously described element may be identified by a similar or identical reference number without repeating an overlapping description thereof.

Referring to FIG. 5, when measured in the second direction Y, the longest length BPL1 of each of the spacers 120 may be substantially equal to the length IL1 of each of the first insulating patterns 111 and/or the length IL2 of each of the second insulating patterns 112. When measured in the second direction Y, the shortest length SPL2 of the spacer 120 may be smaller than the length IL1 of the first insulating pattern 111 and the length IL2 of the second insulating pattern 112. When measured in the second direction Y, the shortest length SPL2 of the spacer 120 may be substantially equal to the longest length LL2 of the corresponding bottom electrode BE.

FIGS. 6A to 11A are plan views illustrating a method of fabricating a variable resistance memory device, according to some embodiments of the inventive concept. FIGS. 6B to 11B are cross-sectional views, which are taken along I-I' of FIGS. 6A to 11A respectively to illustrate a method of fabricating a variable resistance memory device, according to some embodiments of the inventive concept. FIGS. 6C to 11C are cross-sectional views, which are taken along II-II' of FIGS. 6A to 11A respectively to illustrate a method of fabricating a variable resistance memory device, according to some embodiments of the inventive concept.

Figure 6A:
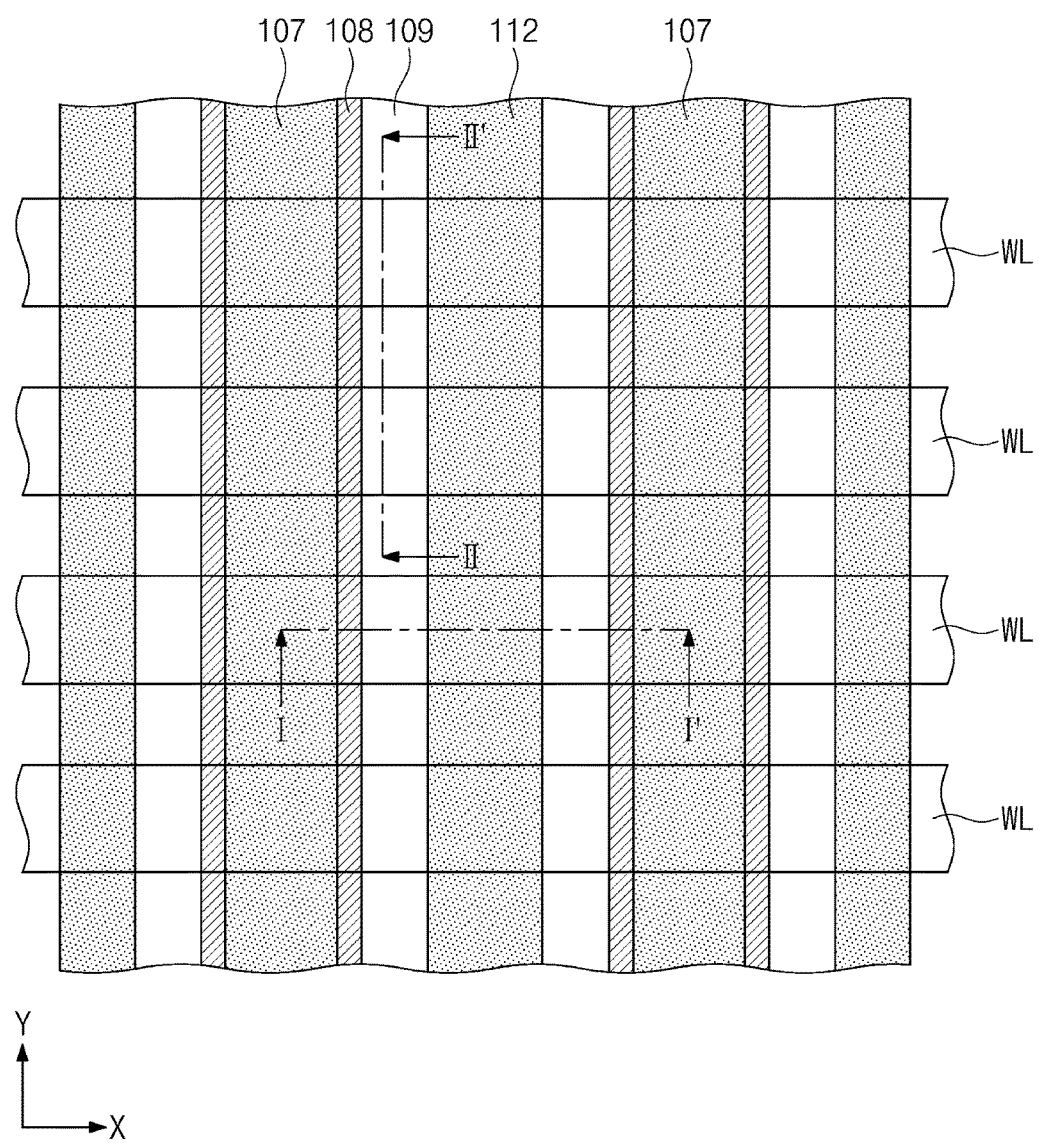
Figure 6B:
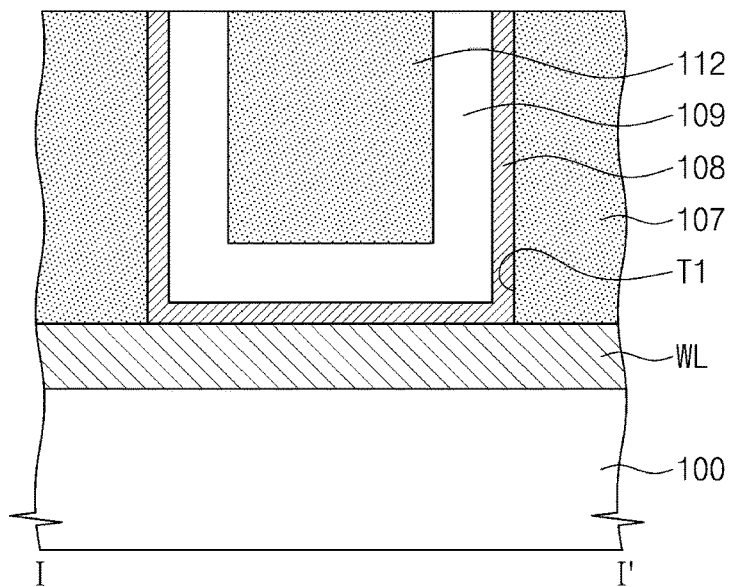
Figure 6C:
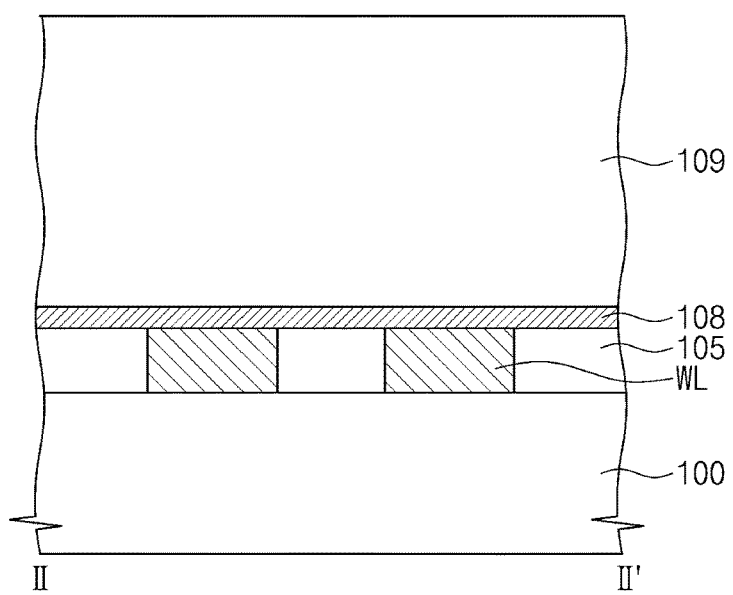

Referring to FIGS. 6A to 6C, the word lines WL may be formed on the substrate 100. The substrate 100 may be formed of or include a single-crystalline semiconductor material. For example, the substrate 100 may be a silicon substrate, a silicon-on-insulator (SOI) substrate, a germanium substrate, a germanium-on-insulator (GOI) substrate, and/or a silicon-germanium substrate.

The word lines WL and the first interlayered insulating layer 105 may be formed on the substrate 100. In some embodiments, the formation of the word lines WL may include forming a conductive layer on the substrate 100 and performing a patterning process on the conductive layer, and the formation of the first interlayered insulating layer 105 may include forming an insulating layer (not shown) on the substrate 100 to cover the word lines WL and performing a planarization process to expose the top surfaces of the word lines WL. In certain embodiments, the first interlayered insulating layer 105 with trenches (not shown) may be formed on the substrate 100, and the word lines WL may be formed by filling the trenches with a conductive material. The word lines WL may extend in the first direction X and parallel to each other. The first interlayered insulating layer 105 may be formed of or include, for example, silicon nitride. The word lines WL may be formed of or include, for example, at least one of metallic materials (e.g., copper and aluminum) or conductive metal nitride materials (e.g., TiN and WN).

A first insulating layer 107 may be formed on the first interlayered insulating layer 105. The first insulating layer 107 may be formed to have a first trench T1. The first trench T1 may extend in the second direction Y. The first trench T1 may be formed to expose portions of the word lines WL arranged in the second direction Y and portions of the first interlayered insulating layer 105. The first insulating layer 107 may be formed of or include, for example, silicon nitride.

An electrode pattern 108, a spacer pattern 109, and a second insulating pattern 112 may be formed in the first trench T1 of the first insulating layer 107. For example, a metal layer (not shown) may be formed to conformally cover side surfaces of the first insulating layer 107 exposed by the first trench T1, a top surface of the first insulating layer 107, portions of the top surfaces of the word lines WL exposed by the first trench T1, and portions of the top surface of the first interlayered insulating layer 105 exposed by the first trench T1. A spacer insulating layer (not shown) may be formed to conformally cover a top surface of the metal layer, and a second insulating layer (not shown) may be formed on the spacer insulating layer to fill the first trench T1. Thereafter, a planarization process may be performed on the insulating layer, the spacer insulating layer, and the metal layer to expose the top surface of the first insulating layer 107, and as a result, the electrode pattern 108, the spacer pattern 109, and the second insulating pattern 112 may be sequentially formed in the first trench T1. For example, the second insulating pattern 112 may be formed with the second insulating layer. In the first trench T1, the electrode pattern 108, the spacer pattern 109, and the second insulating pattern 112 may extend in the second direction Y.

The electrode pattern 108 may include a conductive material and may be formed of or include, for example, at least one of W, Ti, Al, Cu, C, CN, TiN, TiAlN, TiSiN, TiCN, WN, CoSiN, WSiN, TaN, TaCN, TaSiN, or TiO. In some embodiments, the spacer pattern 109 may be formed of or include an insulating material having an etch selectivity with respect to the first interlayered insulating layer 105 and the first insulating layer 107. For example, the spacer pattern 109 may be formed of or include silicon oxide. In certain embodiments, the spacer pattern 109 may be formed of or include a conductive material having an etch selectivity with respect to the first interlayered insulating layer 105 and the first insulating layer 107. For example, the spacer pattern 109 may be formed of or include poly silicon. The second insulating pattern 112 may be formed of or include an insulating material having an etch selectivity with respect to the spacer pattern 109. For example, the second insulating pattern 112 may be formed of or include silicon nitride.

Figure 7A:
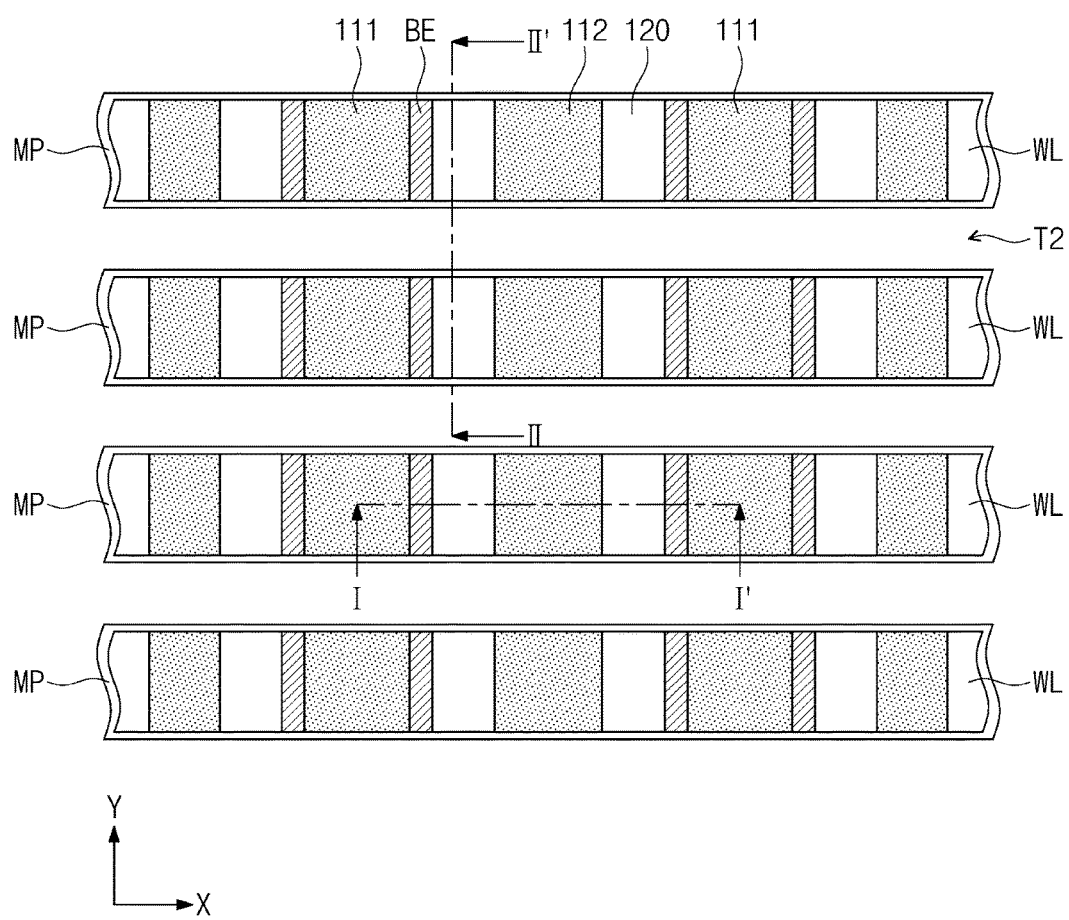
Figure 7B:
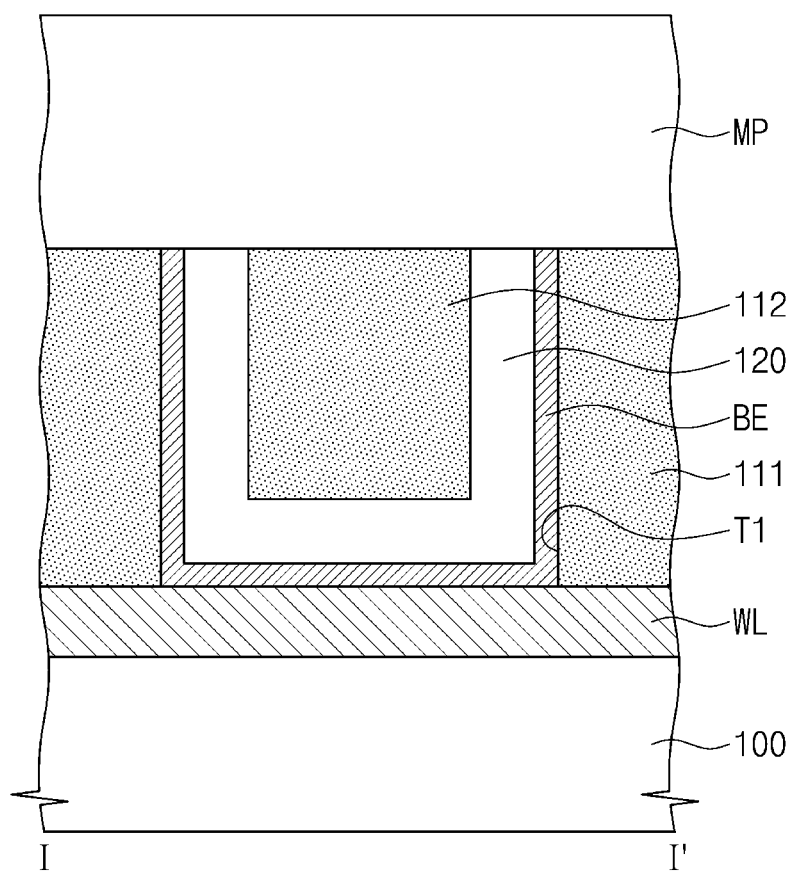
Figure 7C:
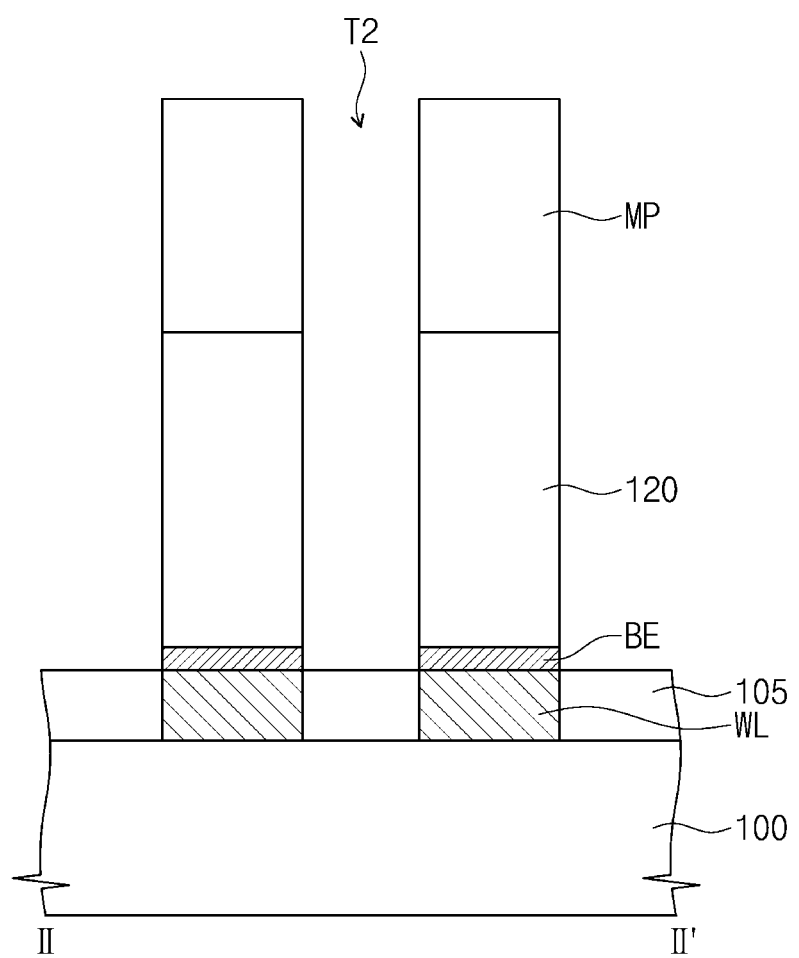

Referring to FIGS. 7A to 7C, mask patterns MP, which extend in the first direction X and parallel to each other, may be formed on the first insulating layer 107 and the second insulating pattern 112. The mask patterns MP may be formed to partially expose the electrode pattern 108, the spacer pattern 109, the second insulating pattern 112, and the first insulating layer 107. As an example, the mask patterns MP may be formed by a double patterning process including steps of depositing a plurality of layers and etching the plurality of layers at least two times. In certain embodiments, the mask patterns MP may be formed by depositing a single layer and then performing a patterning process on the layer. For example, in certain embodiments, the mask patterns MP may be formed by a non-double patterning process. The mask patterns MP may be formed of or include, for example, silicon oxide, silicon nitride, or poly silicon.

The electrode pattern 108, the spacer pattern 109, the second insulating pattern 112, and the first insulating layer 107 may be patterned using the mask patterns MP as an etch mask. Accordingly, a second trench T2 may be formed on the top surface of the first interlayered insulating layer 105 and between the word lines WL. For example, the bottom electrodes BE, the spacers 120, and the first insulating patterns 111 may be formed on the word lines WL. As a result of the patterning process, the second insulating pattern 112 may be divided into a plurality of patterns that are spaced apart from each other in the second direction Y. The second trench T2 may be formed to expose side surfaces of the second insulating patterns 112 facing each other in the second direction Y.

The bottom electrodes BE, which are formed by patterning the electrode pattern 108, may be spaced apart from each other to be discretely arranged in the first and second directions X and Y. Side surfaces of the bottom electrodes BE facing each other in the second direction Y may be exposed by the second trench T2. In a cross-sectional view, the bottom electrodes BE adjacent to each other in the second direction Y may be separated from each other. In a cross-sectional view, a pair of the bottom electrodes BE adjacent to each other in the first direction X may be physically connected to each other. A pair of the spacers 120 adjacent to each other and a corresponding connecting portion CP may be formed on a connected pair of third portions P3 of the adjacent pair of bottom electrodes BE in the first direction X. For example, a pair of the bottom electrodes BE adjacent to each other in the first direction X may be connected with a continuous pattern. For example, a pair of the bottom electrodes BE adjacent to each other in the first direction X may be in contact with each other. Although not illustrated in the drawings, in certain embodiments, the bottom electrodes BE adjacent to each other in the first direction X may be physically separated from each other. For example, in certain embodiments, each of the bottom electrodes BE may not be connected to another bottom electrode BE with the same material as the one forming the bottom electrodes BE.

The spacers 120, which are formed by patterning the spacer pattern 109, may be formed between the bottom electrodes BE and the second insulating patterns 112 respectively. The spacers 120 may be spaced apart from each other to be discretely arranged in the first and second directions X and Y. Side surfaces of the spacers 120 facing each other in the second direction Y may be exposed by the second trench T2. In a cross-sectional view, the spacers 120 adjacent to each other in the second direction Y may be spaced apart from each other. A pair of the spacers 120 adjacent to each other in the first direction X may be physically connected to each other between a connected pair of the bottom electrodes BE and the second insulating patterns 112. For example, a pair of the spacers 120 adjacent to each other in the first direction X may be continuously connected to each other with the same material as the one forming the pair of spacers 120. Although not illustrated in the drawings, in certain embodiments, the spacers 120 adjacent to each other in the first direction X may be physically separated from each other. For example, in certain embodiments, each of the spacers 120 may not be connected to another spacer 120 with the same material as the one forming the spacers 120.

The first insulating patterns 111, which are formed by patterning the first insulating layer 107, may be spaced apart from each other in the first and second directions X and Y. For example, the first insulating patterns 111 arranged in the first direction X may be spaced apart from each other with the second insulating pattern 112, a pair of the spacers 120, and a pair of the bottom electrodes BE interposed therebetween, and the first insulating patterns 111 arranged in the second direction Y may be spaced apart from each other with the second trench T2 interposed therebetween. The second trench T2 may be formed to expose the side surfaces of the second insulating patterns 112 facing each other in the second direction Y. The mask patterns MP may be removed, after the patterning process.

Figure 8A:
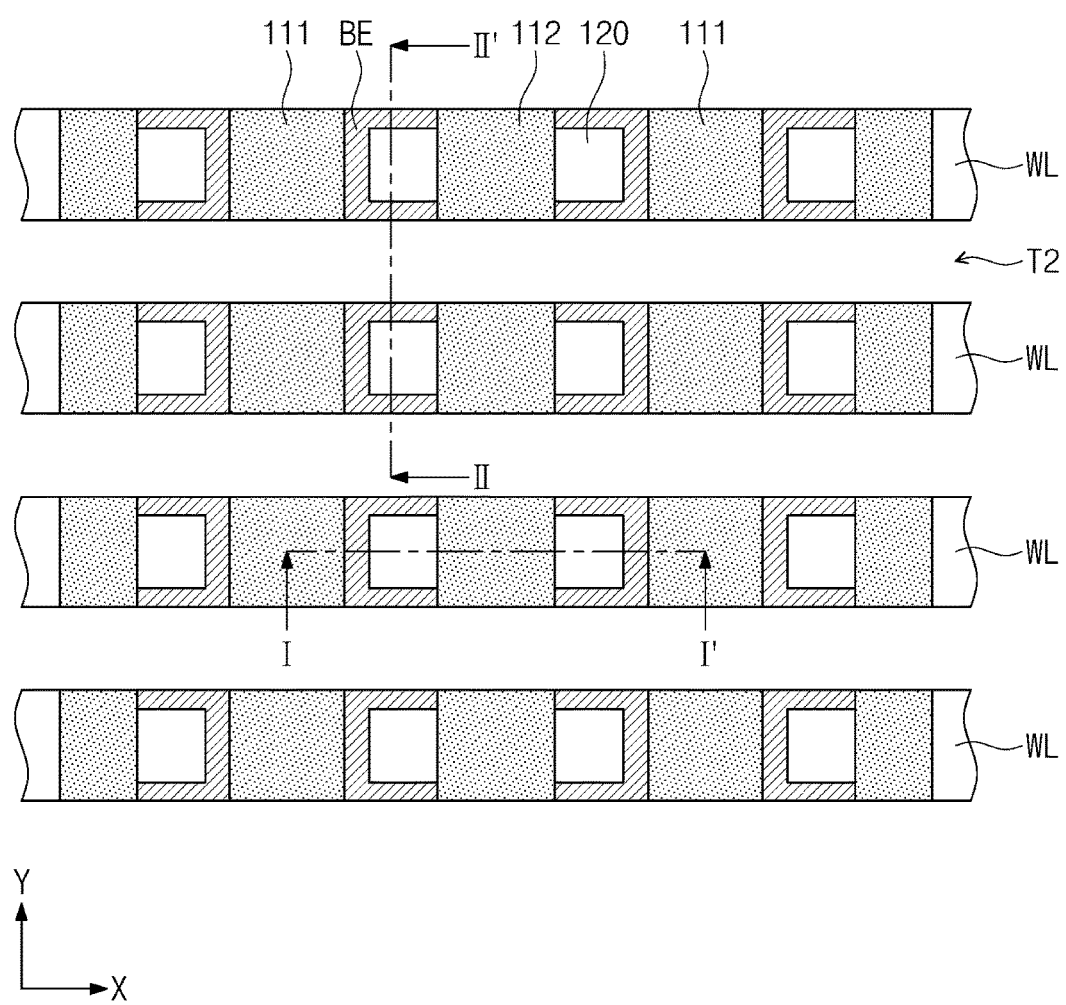
Figure 8B:
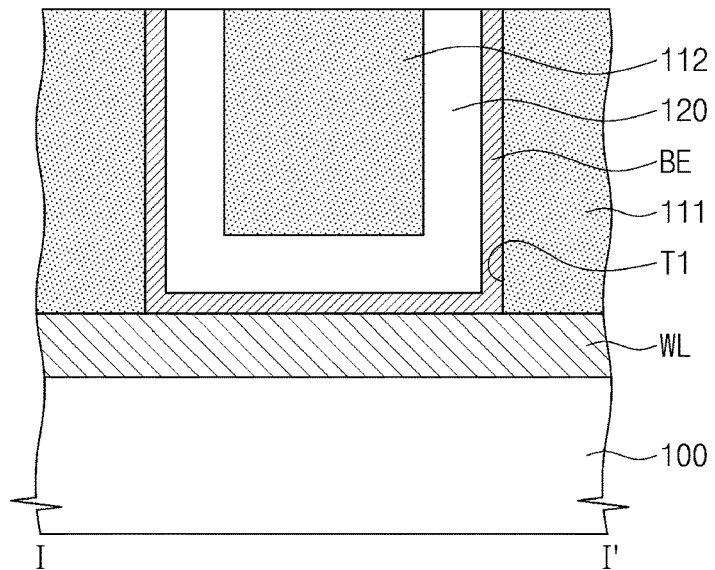
Figure 8C:
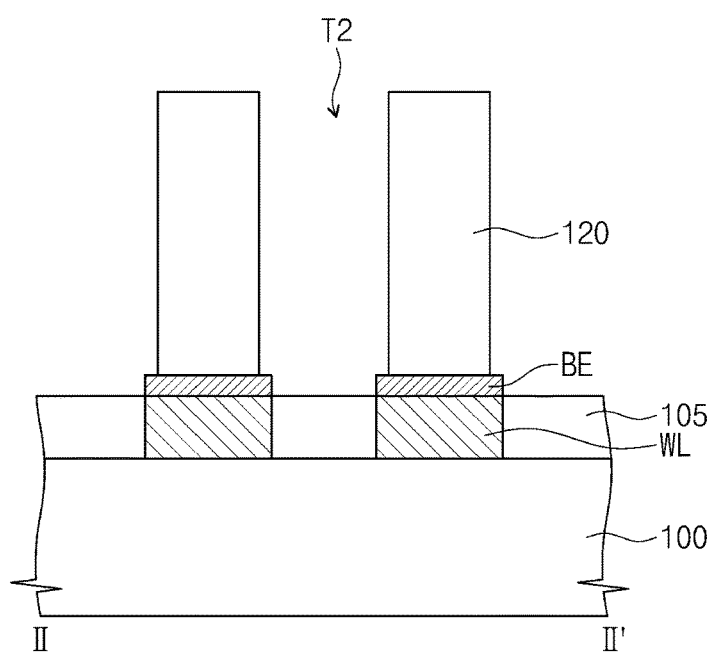

Referring to FIGS. 8A to 8C, a first trimming process may be performed to etch the side surfaces of the spacers 120 exposed by the second trench T2. As a result of the first trimming process, lengths of the spacers 120 in the second direction Y may be decreased, and a distance between the spacers 120 adjacent to each other in the second direction Y may be increased. Since the lengths of the spacers 120 in the second direction Y are decreased, the bottom electrodes BE (e.g., precursors of the bottom electrodes BE) may be partially exposed. The first trimming process may be performed using an etching solution, which is selected to etch the spacers 120 with an etch selectivity with respect to the first and second insulating patterns 111 and 112 and the bottom electrodes BE (e.g., with respect to bottom electrode material). In the case where the spacers 120 include silicon oxide, hydrofluoric acid (HF) may be used as the etching solution.

Figure 9A:
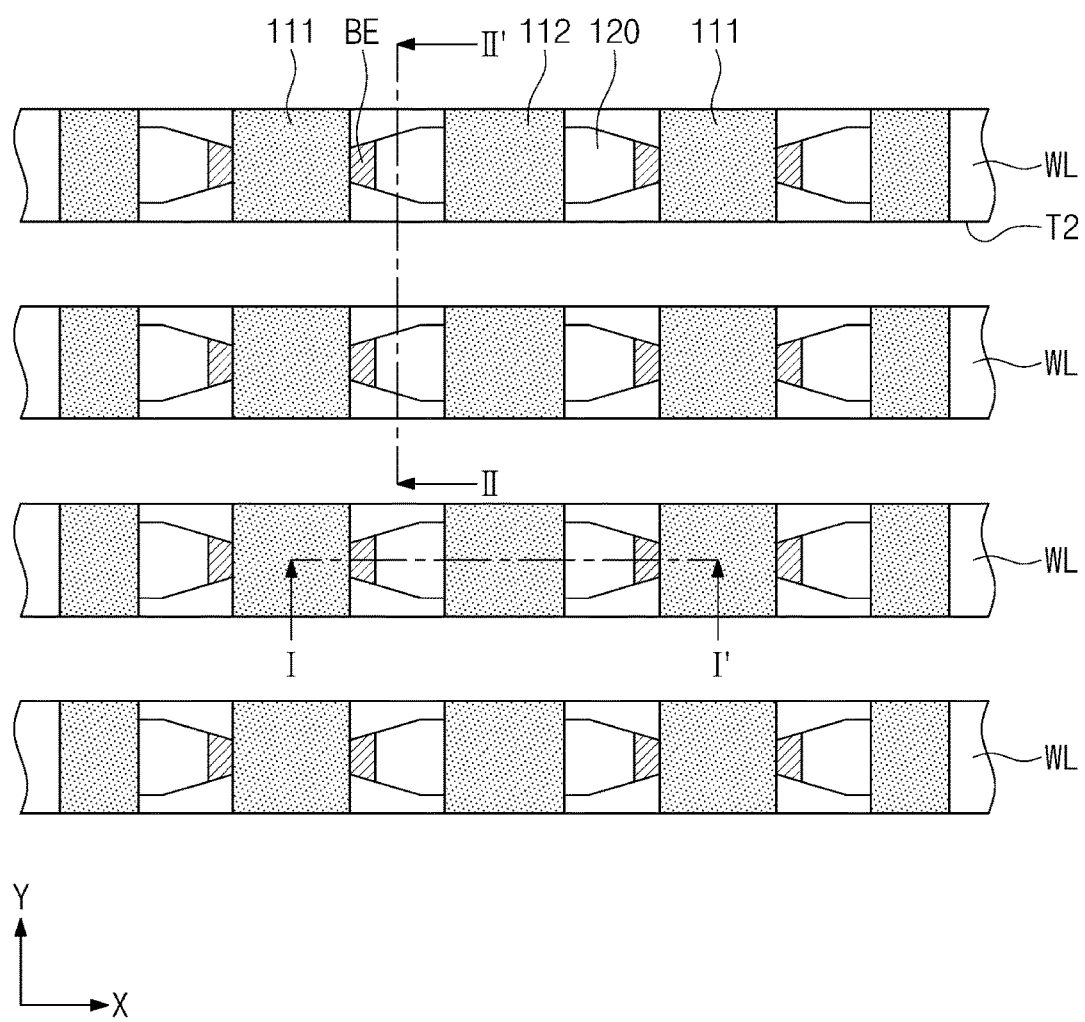
Figure 9B:
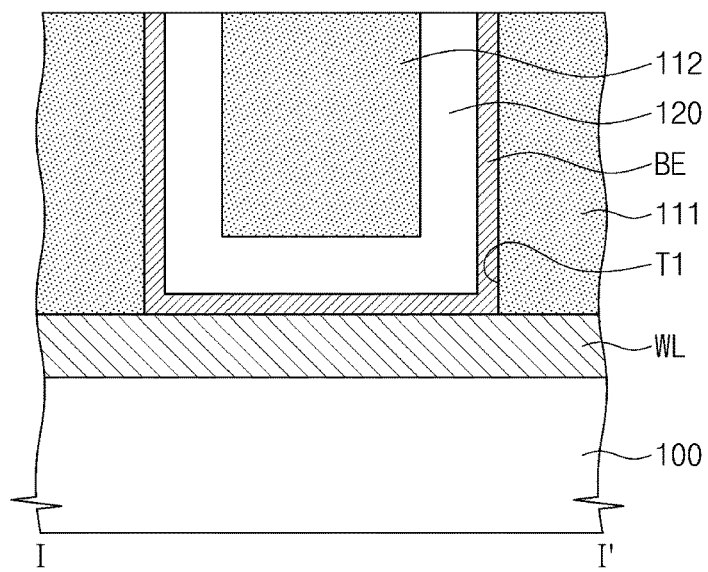
Figure 9C:
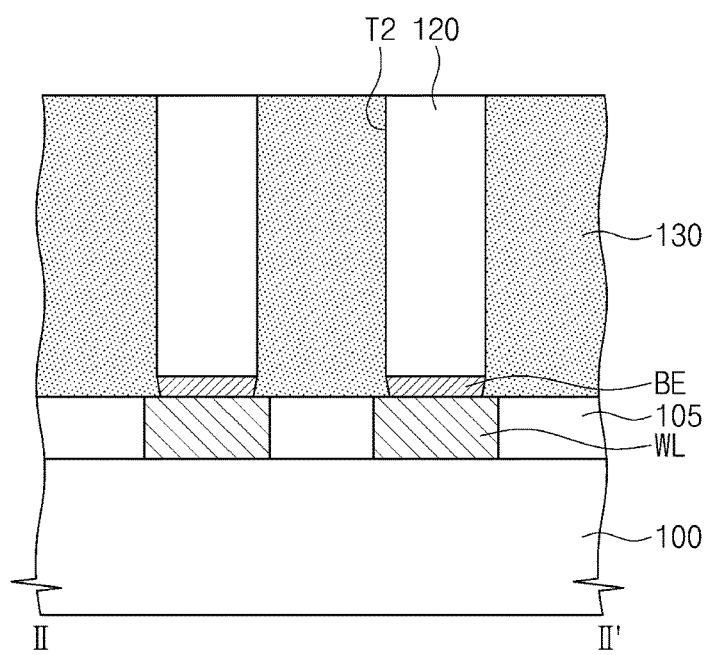

Referring to FIGS. 9A to 9C, a second trimming process may be performed to etch the side surfaces of the bottom electrodes BE exposed by the second trench T2. As a result of the second trimming process, lengths of the bottom electrodes BE in the second direction Y may be decreased, and a distance between the bottom electrodes BE adjacent to each other in the second direction Y may be increased. The second trimming process may be performed using an etching solution, which is selected to etch the bottom electrodes BE with an etch selectivity with respect to the first and second insulating patterns 111 and 112 and the spacers 120.

In some embodiments, during the second trimming process, an etching amount of a portion of the bottom electrode BE adjacent to the first insulating pattern 111 may be different from that of another portion of the bottom electrode BE adjacent to the spacer 120. An etching amount of an upper portion of the bottom electrode BE adjacent to the spacer 120 may be different from that of a lower portion of the bottom electrode BE adjacent to the word line WL. For example, even when the same etching solution is used, an etching depth of the bottom electrode BE may be greater at a region adjacent to the first insulating pattern 111 than an etching depth at another region adjacent to the spacer 120. For example, an etching depth of the bottom electrode BE may be greater at its lower portion adjacent to the word line WL than an etching depth at its upper portion adjacent to the spacer 120. For example, an etching depth of the bottom electrode BE may be greater at its lower portion adjacent to the word line WL than an etching depth at its upper portion adjacent to the connecting portion CP. For example, widths of the third portions P3 of the bottom electrodes BE may be greater at the upper portion adjacent to the connecting portion CP than the widths of the third portions P3 at the lower portions adjacent to the word lines. This may be because the spacers 120 including the connecting portions CP may include silicon oxide, and oxygen atoms in the silicon oxide may be diffused into the portion of the bottom electrode BE adjacent to the spacer 120. For example, the diffusion of the oxygen atoms may lead to a difference in material and/or etching characteristics of the material. For example, etch rates may be different between portions of the bottom electrode BE, which are respectively adjacent to the spacer 120, the first insulating pattern 111, and the word line WL, and this may result in a spatial variation in etching amount or depth of the bottom electrode BE, even when the same etching solution is used.

For example, an oxygen content of the bottom electrode BE may be higher near the spacer 120 than near the first insulating pattern 111 and the word lines WL. The higher the oxygen content of the bottom electrode BE, the smaller the etching amount of the bottom electrode BE. Thus, a length of the bottom electrode BE in the second direction Y may be smaller near the first insulating patterns 111 than near the spacers 120. Similarly, a length of the bottom electrode BE in the second direction Y may be smaller at the lower portion adjacent to the word line WL than at the upper portion adjacent to the connecting portion CP of the spacer 120. As a result, the bottom electrode BE may be formed to have a trapezoidal shape, e.g., in a plan view. For example, in a plan view, the trapezoidal shape of the bottom electrode BE may have a pair parallel sides extending in the second direction Y. For example, a first side of the pair of parallel sides may be positioned at a border between the bottom electrode BE and corresponding spacer 120 being in contact with the bottom electrode, and a second side of the pair of parallel sides may be opposite the first side. For example, the first side is longer than the second side of the trapezoidal shape of the bottom electrode BE. For example, in a cross-sectional view as shown in FIG. 9C, the third portion P3 of the bottom electrode BE may have a trapezoidal shape. For example, in a cross-sectional view crossing the word lines WL perpendicularly as shown in FIG. 9C, the trapezoidal shape of the third portion P3 may have a pair of parallel sides extending in the second direction Y. For example, a third side of the pair of parallel sides of the third portion P3 may be positioned at an upper border of the third portion P3 and/or a border between the third portion P3 and the connecting portion CP. For example, a fourth side of the pair of parallel sides may be positioned at a lower border of the third portion P3 and/or a border between the third portion P3 and the word line. For example, the third side is longer than the fourth side of the trapezoidal shape of the third portion P3.

When the side surfaces of the bottom electrodes BE are etched, portions of the spacers 120 adjacent to the bottom electrodes BE may also be etched. Thus, a length of the spacers 120 in the second direction Y may be smaller near the bottom electrode BE than near the second insulating pattern 112.

After the second trimming process on the bottom electrodes BE is finished, the third insulating pattern 130 may be formed in the second trench T2. The third insulating pattern 130 may be formed of or include the same insulating material (e.g., silicon nitride) as the first and second insulating patterns 111 and 112.

In a plan view, each of the bottom electrodes BE, e.g., a top surface of the bottom electrode BE, may be provided to have a shorter length in the first direction X than a length in the second direction Y. For example, in certain embodiments, a distance between the bottom electrodes BE adjacent to each other in the second direction Y may be shorter than a distance between the bottom electrodes BE adjacent to each other in the first direction X. In this case, heat generated from the bottom electrode BE of a selected variable resistance memory device may be transmitted to the phase-changeable patterns 140 (e.g., of FIG. 2) adjacent thereto in the second direction Y, thereby causing a change in phase of the phase-changeable patterns 140. This may lead to deterioration in data retention characteristics of the variable resistance memory device.

By contrast, according to some embodiments of the inventive concept, the bottom electrodes BE may be formed to have reduced lengths in the second direction Y, and thus, it may increase a distance between the bottom electrodes BE facing each other in the second direction Y. Accordingly, heat generated from the bottom electrode BE of a selected variable resistance memory device, may be less transmitted to the phase-changeable patterns 140 (e.g., of FIG. 2) adjacent thereto in the second direction Y, e.g., phase-changeable patterns in adjacent cells. This may improve reliability of the variable resistance memory device.

Figure 10A:
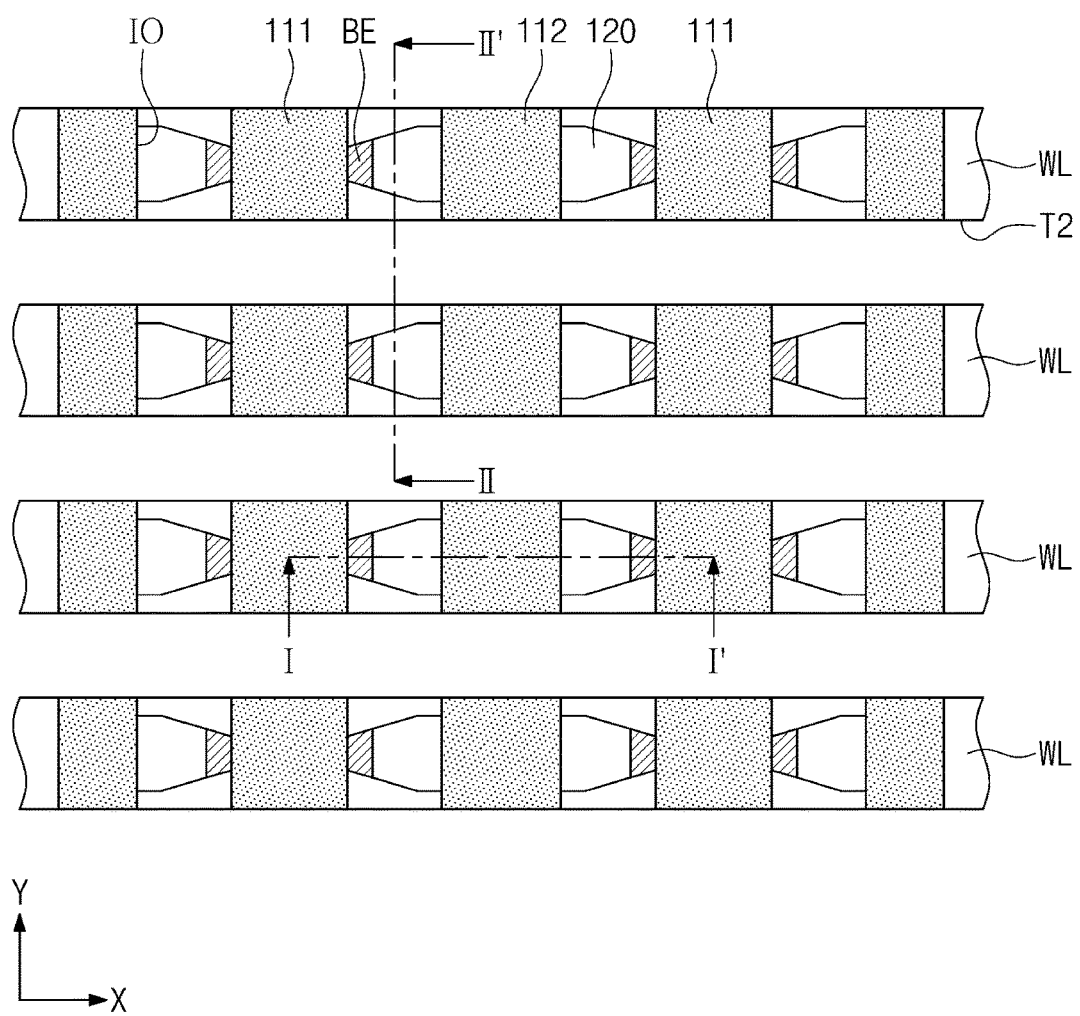
Figure 10B:
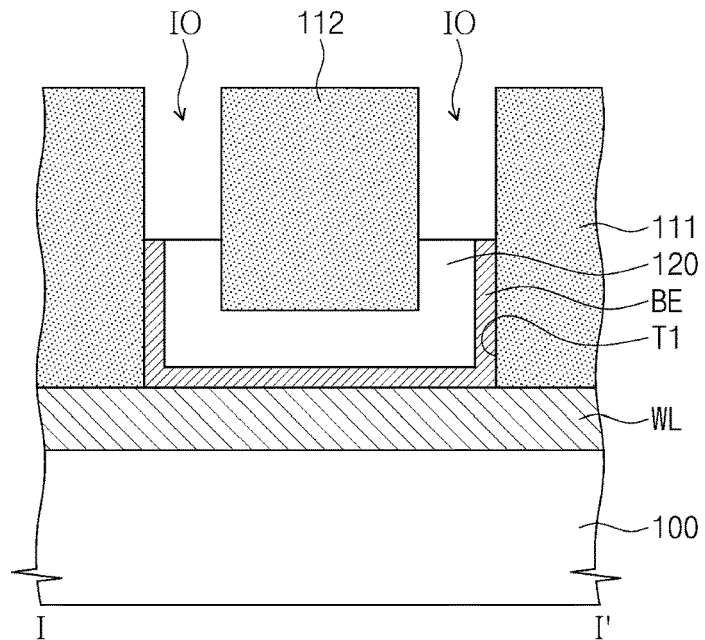
Figure 10C:
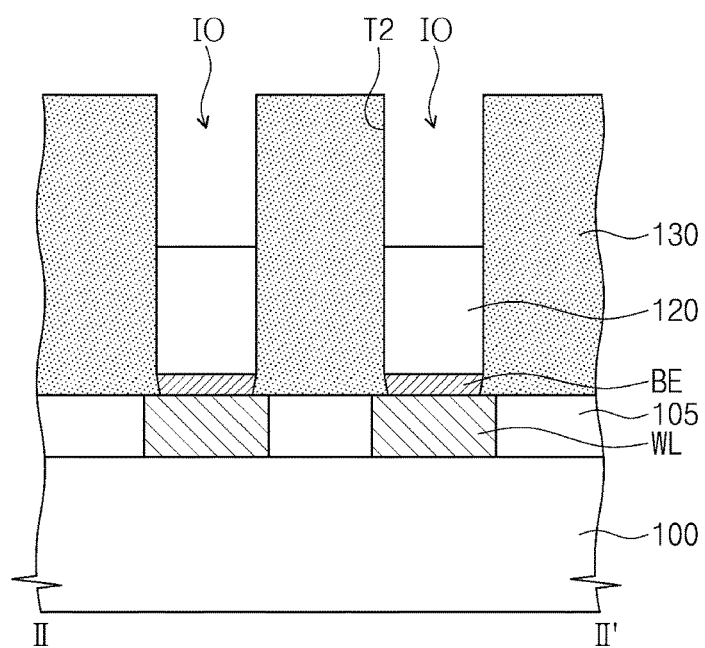

Referring to FIGS. 10A to 10C, upper portions of the bottom electrodes BE and the spacers 120 may be sequentially etched. Accordingly, the top surfaces of the bottom electrodes BE and the top surfaces of the spacers 120 may be recessed from the top surfaces of the first to third insulating patterns 111, 112, and 130 to form internal spaces IO on the bottom electrodes BE and the spacers 120. The internal spaces IO may be gap regions that are surrounded by the first to third insulating patterns 111, 112, and 130.

Figure 11A:
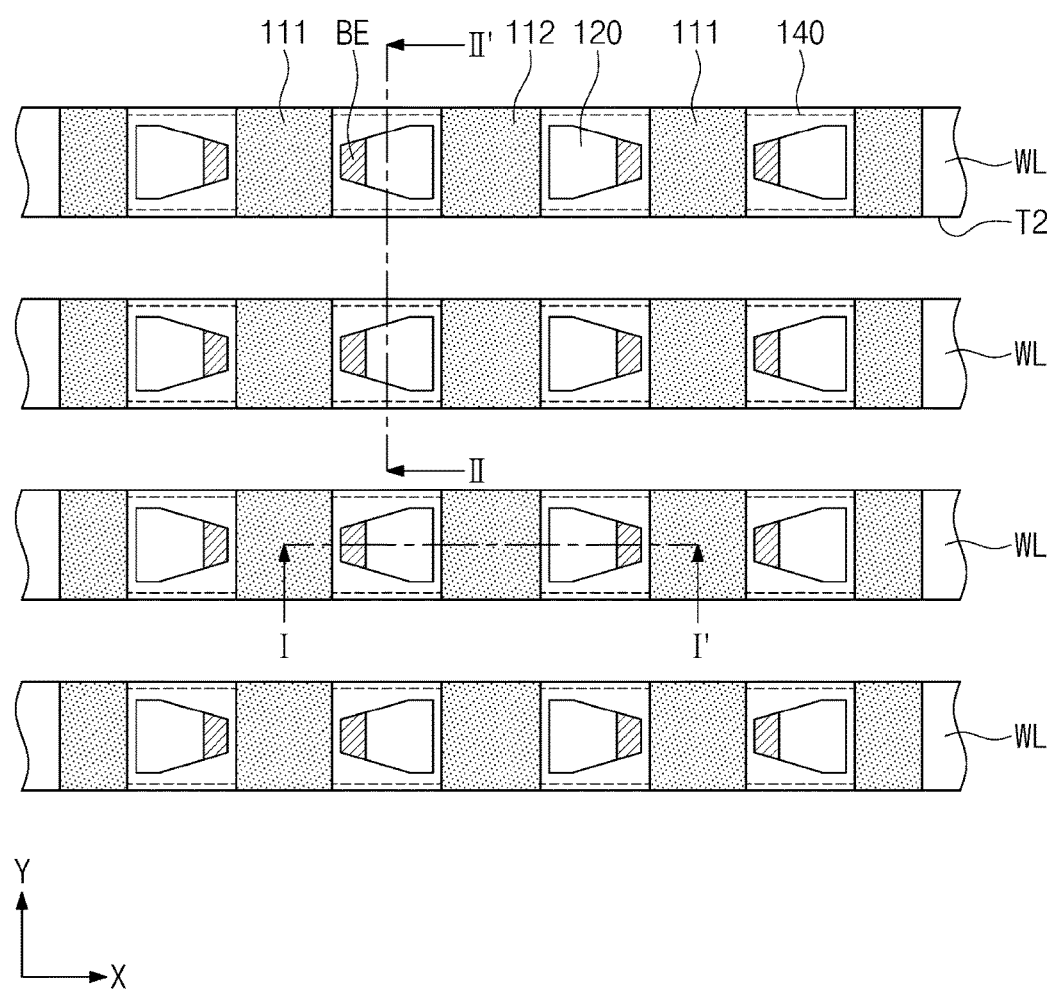
Figure 11B:
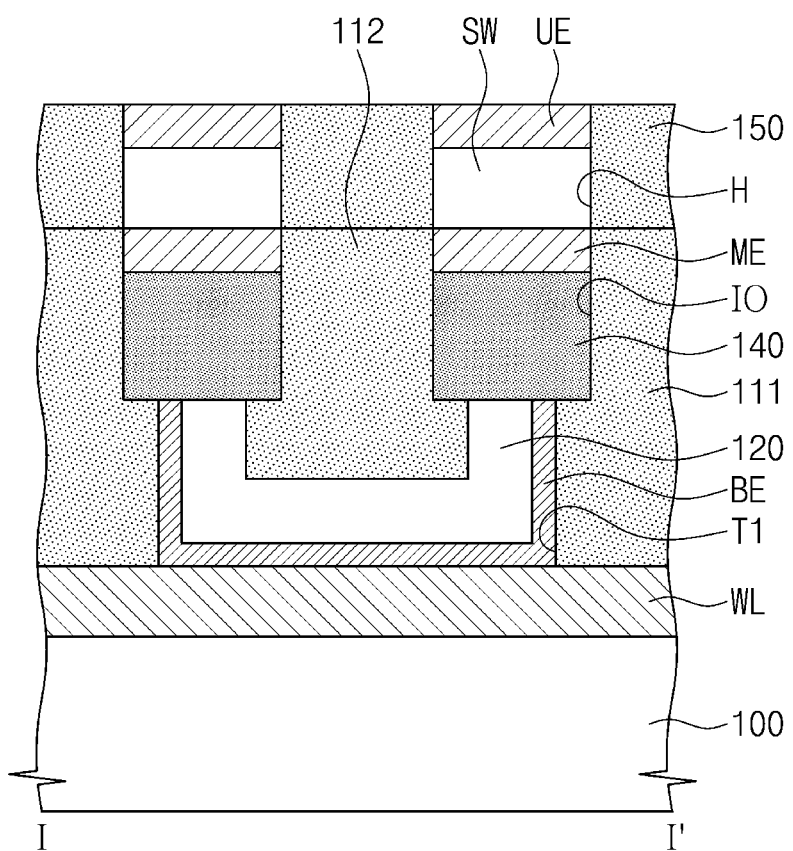
Figure 11C:
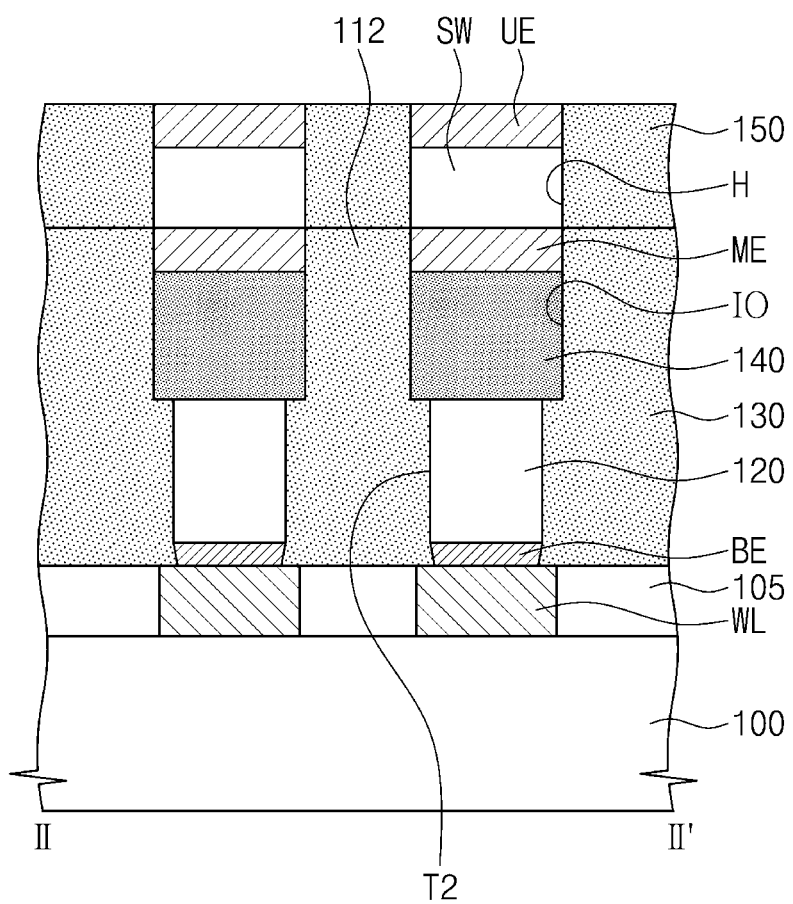

Referring to FIGS. 11A to 11C, an etching process may be performed to enlarge the internal spaces IO (i.e., to increase widths of the internal spaces IO). The etching process may be performed to etch the side surfaces of the first to third insulating patterns 111, 112, and 130 surrounding the internal spaces IO, for example, in a dry etching manner. As a result of the etching process, the internal spaces IO may have a reduced aspect ratio, and thus, it may be possible to reduce void issues that may occur in a subsequent process forming the phase-changeable patterns 140 in the internal spaces IO. When measured in the first direction X, a width of each of the internal spaces IO may be larger than a sum of a width of a corresponding bottom electrode BE and a width of a corresponding spacer 120 exposed by the internal space IO. For example, first insulating patterns 111 and/or second insulating patterns 112 may be exposed at the bottom of the internal spaces IO. When measured in the second direction Y, a width of the internal space IO may be larger than a width of the bottom electrode BE and/or a width of the spacer 120.

The phase-changeable patterns 140 may be formed in the internal spaces IO. The formation of the phase-changeable patterns 140 may include forming a phase-changeable layer to cover the internal spaces IO and the top surfaces of the first to third insulating patterns 111, 112, and 130, and etching the phase-changeable layer to expose the top surfaces of the first to third insulating patterns 111, 112, and 130. In certain embodiments, the etching of the phase-changeable layer may be performed in such a way that upper portions of the phase-changeable patterns 140 are further etched. Accordingly, the top surfaces of the phase-changeable patterns 140 may be recessed from the top surfaces of the first to third insulating patterns 111, 112, and 130, and the internal spaces IO may not be completely filled with the phase-changeable patterns 140. For example, a top surface of the phase-changeable patterns 140 may be lower than a top surface of the first to third insulating patterns 111, 112 and 130.

As an example, the phase-changeable patterns 140 may be formed of a compound containing at least one of chalcogenide elements (e.g., Te and Se) and at least one of, for example, Ge, Sb, Bi, Pb, Sn, Ag, As, S, Si, In, Ti, Ga, P, O, or C. As an example, the phase-changeable patterns 140 may be formed of or include at least one of GeSbTe, GeTeAs, SbTeSe, GeTe, SbTe, SeTeSn, GeTeSe, SbSeBi, GeBiTe, GeTeTi, InSe, GaTeSe, or InSbTe.

In certain embodiments, the phase-changeable patterns 140 may be formed of or include at least one of perovskite compounds or conductive metal oxides. For example, the phase-changeable patterns 140 may be formed of or include at least one of niobium oxide, titanium oxide, nickel oxide, zirconium oxide, vanadium oxide, PCMO((Pr,Ca)MnO3), strontium-titanium oxide, barium-strontium-titanium oxide, strontium-zirconium oxide, barium-zirconium oxide, or barium-strontium-zirconium oxide. In the case where the phase-changeable patterns 140 include a transition metal oxide, the phase-changeable patterns 140 may have a dielectric constant higher than that of a silicon oxide layer. In certain embodiments, the phase-changeable patterns 140 may have a double-layered structure including a conductive metal oxide layer and a tunnel insulating layer or a triple-layered structure including a first conductive metal oxide layer, a tunnel insulating layer, and a second conductive metal oxide. The tunnel insulating layer may include a layer of aluminum oxide, hafnium oxide, or silicon oxide.

The middle electrodes ME may be formed on the phase-changeable patterns 140. The middle electrodes ME may be formed to completely fill the internal spaces IO, in which the phase-changeable patterns 140 are provided. The middle electrodes ME may be formed of or include, for example, at least one of W, Ti, Al, Cu, C, CN, TiN, TiAlN, TiSiN, TiCN, WN, CoSiN, WSiN, TaN, TaCN, TaSiN, or TiO.

The second interlayered insulating layer 150 may be formed on the first to third insulating patterns 111, 112, and 130. The second interlayered insulating layer 150 may be formed to have holes H exposing the top surfaces of the middle electrodes ME. The second interlayered insulating layer 150 may be formed of or include, for example, silicon nitride.

The switching devices SW and the upper electrodes UE may be sequentially formed in the holes H. The switching devices SW may be formed to fill lower portions of the holes H, and the upper electrodes UE may be formed on top surfaces of the switching devices SW to fill upper portions of the holes H. The switching devices SW may be formed of a compound containing at least one of chalcogenide elements (e.g., Te and Se) and at least one of, for example, Ge, Sb, Bi, Al, Pb, Sn, Ag, As, S, Si, In, Ti, Ga, or P. The switching devices SW may further contain a thermal stabilization element, in addition to the compound. The thermal stabilization element may be at least one of C, N, or O. As an example, the switching devices SW may be formed of or include at least one of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, or GeAsBiSe. The upper electrodes UE may be formed of or include, for example, at least one of W, Ti, Al, Cu, C, CN, TiN, TiAlN, TiSiN, TiCN, WN, CoSiN, WSiN, TaN, TaCN, TaSiN, or TiO.

Referring back to FIGS. 1, 2A, and 2B, the bit lines BL may be formed on the upper electrodes UE. The bit lines BL may be formed to extend in the second direction Y and to cross the word lines WL. Each of the bit lines BL may be electrically connected to the upper electrodes UE arranged in the second direction Y. The bit lines BL may be formed of or include, for example, at least one of metallic materials (e.g., copper and aluminum) or conductive metal nitride materials (e.g., TiN and WN).

According to some embodiments of the inventive concept, bottom electrodes may be formed to have reduced lengths in a second direction, and thus, a distance between the bottom electrodes facing each other in the second direction may be increased. Accordingly, heat generated from a bottom electrode of a selected variable resistance memory device may be prevented from being transmitted to phase-changeable patterns adjacent thereto (or such heat transmission may be reduced), e.g., in adjacent cells. This may reduce unintended phase changes of the phase-changeable patterns, and thereby improve reliability of the variable resistance memory device.

While example embodiments of the inventive concepts have been particularly shown and described, it will be understood by one of ordinary skill in the art that variations in form and detail may be made therein without departing from the spirit and scope of the attached claims.

What is claimed is:

1. A variable resistance memory device, comprising:
    a word line extending in a first direction;
    a bit line extending in a second direction crossing the first direction,
    a phase-changeable pattern provided between the word line and the bit line;
    a bottom electrode provided between the phase-changeable pattern and the word line; and
    a spacer provided on a side surface of the bottom electrode and between the phase-changeable pattern and the word line,
    wherein the bottom electrode comprises a first portion and a second portion, and the second portion is provided between the first portion and the spacer, and
    the first and second portions have different lengths from each other in the second direction.

2. The device of claim 1, wherein the first portion is shorter than the second portion in the second direction.

3. The device of claim 2, wherein a longest length of the first portion of the bottom electrode in the second direction is equal to a shortest length of the second portion of the bottom electrode in the second direction.

4. The device of claim 1, wherein the lengths of the first and second portions in the second direction are shorter than a length of the phase-changeable pattern in the second direction.

5. The device of claim 1, wherein a length of the spacer in the second direction is shorter than the phase-changeable pattern in the second direction.

6. The device of claim 1, wherein a length of the spacer in the second direction is equal to a length of the phase-changeable pattern in the second direction.

7. The device of claim 1, wherein the spacer comprises a first spacer portion and a second spacer portion, and the second spacer portion is provided between the first spacer portion and the second portion of the bottom electrode, and
a length of the first spacer portion in the second direction is larger than a length of the second spacer portion in the second direction.

8. The device of claim 7, wherein the length of the second spacer portion is equal to the length of the second portion of the bottom electrode in the second direction.

9. The device of claim 1, wherein an oxygen content of the second portion of the bottom electrode is higher than that of the first portion of the bottom electrode.

10. The device of claim 1, wherein the bottom electrode further comprises a third portion interposed between the spacer and the word line, and
a width in the second direction of an upper portion of the third portion adjacent to the spacer is larger than a width in the second direction of a lower portion of the third portion adjacent to the word line.

11. The device of claim 10, wherein the width in the second direction of the upper portion of the third portion is equal to the width in the second direction of the spacer.

12. A variable resistance memory device, comprising:
word lines extending in a first direction;
bit lines extending in a second direction crossing the first direction,
phase-changeable patterns provided between the word lines and the bit lines,
bottom electrodes provided between the phase-changeable patterns and the word lines; and
spacers provided on side surfaces of the bottom electrodes and between the phase-changeable patterns and the word lines,
wherein each of the bottom electrodes comprises a first portion and a second portion, and the second portion is disposed between the first portion and a corresponding spacer contacting the second portion, and
a distance between the first portions of the bottom electrodes adjacent to each other in the second direction is larger than a distance between the second portions of the bottom electrodes adjacent to each other in the second direction.

13. The device of claim 12, wherein a shortest distance between the first portions of the bottom electrodes adjacent to each other in the second direction is equal to a longest distance between the second portions of the bottom electrodes adjacent to each other in the second direction.

14. The device of claim 12, wherein a distance between the second portions of the bottom electrodes adjacent to each other in the second direction is larger than a distance between the phase-changeable patterns adjacent to each other in the second direction.

15. The device of claim 12, wherein a distance between the spacers adjacent to each other in the second direction is larger than a distance between the phase-changeable patterns adjacent to each other in the second direction.

16. A memory device, comprising:
a word line formed on a substrate, the word line extending in a first direction;
a bit line formed on the substrate, the bit line extending in a second direction crossing the first direction;
a first electrode pattern formed on the word line;
a phase-changeable pattern formed on the first electrode pattern, the phase-changeable pattern contacting the first electrode pattern;
an insulator pattern formed between the phase-changeable pattern and the word line, the insulator pattern being in contact with the phase-changeable pattern and the first electrode pattern; and
a second electrode pattern formed on the phase-changeable pattern, the second electrode pattern being in contact with the phase-changeable pattern,
wherein a contact surface of the insulator pattern where it contacts the phase-changeable pattern is longer in the second direction than a contact surface of the first electrode pattern where it contacts the phase-changeable pattern in the second direction, and the contact surface of the insulator pattern where it contacts the phase-changeable pattern and the contact surface of the first electrode pattern where it contacts the phase-changeable pattern together have a tapered shape.

17. The memory device of claim 16, wherein the phase-changeable pattern comprises a material of which phase is reversibly switched between crystalline and amorphous states depending on temperature of the phase-changeable pattern.

18. The memory device of claim 16, wherein the phase-changeable pattern is longer in the second direction than the contact surface of the insulator pattern where it contacts the phase-changeable pattern.

19. The memory device of claim 16, wherein the first electrode pattern is configured to apply heat to the phase-changeable pattern.

20. The memory device of claim 16, wherein the contact surface of the first electrode pattern where it contacts the phase-changeable pattern has a longer side at a border being in contact with the insulator pattern than an opposing side of the contact surface of the first electrode pattern where it contacts the phase-changeable pattern.

* * * * *